(12) United States Patent
Marciano et al.

(10) Patent No.: US 11,333,982 B2
(45) Date of Patent: May 17, 2022

(54) SCALING METRIC FOR QUANTIFYING METROLOGY SENSITIVITY TO PROCESS VARIATION

(71) Applicant: KLA Corporation, Milpitas, CA (US)

(72) Inventors: Tal Marciano, Yokneam (IL); Noa Armon, R.D. Misgav (IL); Dana Klein, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/741,574

(22) Filed: Jan. 13, 2020

(65) Prior Publication Data
US 2020/0241428 A1  Jul. 30, 2020

Related U.S. Application Data

(60) Provisional application No. 62/797,557, filed on Jan. 28, 2019.

(51) Int. Cl.
*G03F 7/20* (2006.01)
*G06F 17/18* (2006.01)

(52) U.S. Cl.
CPC ...... *G03F 7/70633* (2013.01); *G03F 7/70491* (2013.01); *G06F 17/18* (2013.01)

(58) Field of Classification Search
CPC ........................ G03F 7/70633; G03F 7/70491
See application file for complete search history.

(56) References Cited

U.S. PATENT DOCUMENTS

| 7,791,732 | B2 | 9/2010 | Boef et al. |
| 7,873,504 | B1 | 1/2011 | Bevis |
| 8,411,287 | B2 | 4/2013 | Smilde et al. |
| 9,081,303 | B2 | 7/2015 | Cramer et al. |
| 2006/0066855 | A1 | 3/2006 | Boef et al. |
| 2008/0094639 | A1 | 4/2008 | Widmann et al. |
| 2011/0027704 | A1 | 2/2011 | Cramer et al. |
| 2011/0043791 | A1 | 2/2011 | Smilde et al. |
| 2012/0242940 | A1 | 9/2012 | Nagata et al. |

(Continued)

FOREIGN PATENT DOCUMENTS

WO  2018160502 A1  9/2018

OTHER PUBLICATIONS

International Search Report and Written Opinion dated May 14, 2020 for PCT/US2020/014308.

*Primary Examiner* — Steven Whitesell Gordon
(74) *Attorney, Agent, or Firm* — Suiter Swantz pc llo

(57) ABSTRACT

An overlay metrology system includes a controller to receive, from an overlay metrology tool, overlay measurements on multiple sets of overlay targets on a sample with a range of values of a measurement parameter, where a particular set of overlay targets includes overlay targets having one of two or more overlay target designs. The controller may further determine scaling metric values for at least some of the overlay targets, where the scaling metric for a particular overlay target is based on a standard deviation of the overlay measurements of the corresponding set of overlay targets. The controller may further determine a variability of the scaling metric values for each of the two or more sets of overlay targets. The controller may further select, as an output overlay target design, one of the two or more overlay target designs having a smallest scaling metric variability.

27 Claims, 16 Drawing Sheets

(56) References Cited

U.S. PATENT DOCUMENTS

| | | |
|---|---|---|
| 2013/0035888 A1 | 2/2013 | Kandel et al. |
| 2015/0185625 A1 | 7/2015 | Chen et al. |
| 2017/0160074 A1 | 6/2017 | Mossavat et al. |
| 2018/0088470 A1* | 3/2018 | Bhattacharyya .... G03F 7/70633 |
| 2018/0160502 A1 | 6/2018 | Casey et al. |

* cited by examiner

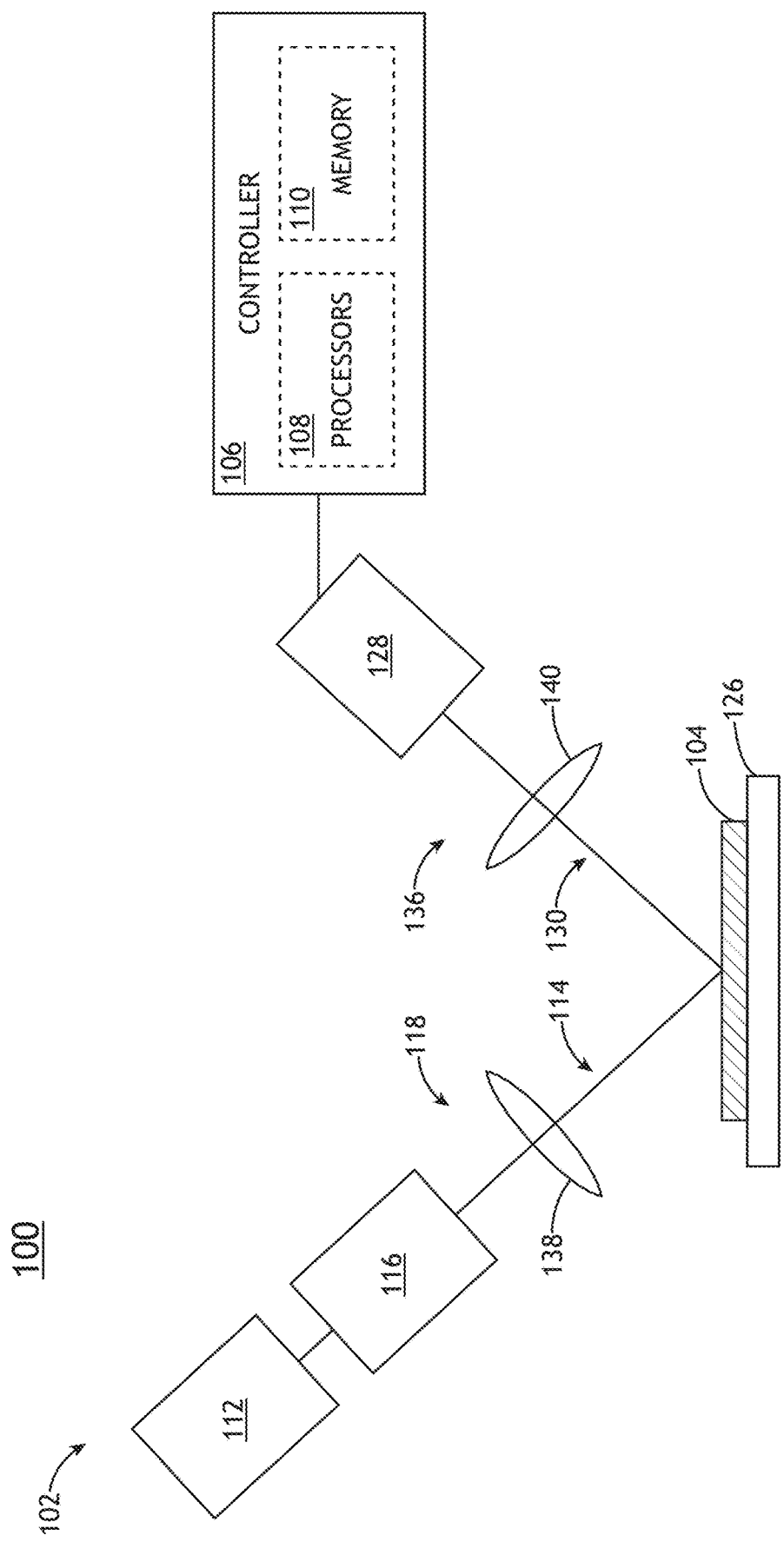

SCALING METRIC FOR QUANTIFYING METROLOGY SENSITIVITY TO PROCESS VARIATION

CROSS-REFERENCE TO RELATED APPLICATION

The present application claims the benefit The present application claims the benefit under 35 U.S.C. § 119(e) of U.S. Provisional Application Ser. No. 62/797,557, filed Jan. 28, 2019, entitled SCALING METRIC SMETRIC FOR QUANTIFYING METROLOGY CONFIGURATION'S SENSITIVITY TO PROCESS VARIATION, naming Tal Marciano, Noa Armon, and Dana Klein as inventors, which is incorporated herein by reference in the entirety.

TECHNICAL FIELD

The present disclosure is related generally to overlay metrology and, more particularly, to evaluating robustness of overlay metrology to process variations.

BACKGROUND

Overlay metrology systems typically measure the alignment of multiple layers of a sample by characterizing an overlay target having target features located on sample layers of interest. Further, the overlay alignment of the multiple layers is typically determined by aggregating overlay measurements of multiple overlay targets at various locations across the sample. However, the accuracy and/or repeatability of an overlay measurement of an overlay target may be sensitive to variations of process parameters during fabrication of the overlay target and/or measurement parameters used to inspect a fabricated overlay target. For example, process parameter variations (e.g., associated with layer deposition, pattern exposure, etching, or the like) may lead to deviations of a fabricated overlay target from an intended design (e.g., asymmetries in sidewall angles, or the like) that may introduce error into an overlay measurement. By way of another example, the accuracy of an overlay measurement of a given fabricated overlay target may vary based on exact values of measurement parameters associated with an overlay metrology tool (e.g., wavelength, polarization, or the like). Accordingly, it may be desirable to provide systems or methods for evaluating the robustness of overlay target designs.

SUMMARY

An overlay metrology system is disclosed in accordance with one or more illustrative embodiments of the present disclosure. In one illustrative embodiment, the system includes a controller to be communicatively coupled with an overlay metrology tool. In another illustrative embodiment, the controller receives, from the overlay metrology tool, overlay measurements on two or more sets of overlay targets on a sample with a plurality of values of a measurement parameter for configuring the overlay metrology tool, where a particular set of overlay targets includes overlay targets having one of two or more overlay target designs. In another illustrative embodiment, the controller determines scaling metric values for at least some of the overlay targets in the two or more sets of overlay targets, where the scaling metric for a particular overlay target is based on a standard deviation of the overlay measurements of the corresponding set of overlay targets. In another illustrative embodiment, the controller determines a variability of the scaling metric values for each of the two or more sets of overlay targets. In another illustrative embodiment, the controller selects, as an output overlay target design, one of the two or more overlay target designs having a smallest scaling metric variability, wherein the output overlay target design is provided to one or more fabrication tools to fabricate an overlay target based on the output overlay target design on a test sample for measurement with the overlay metrology tool.

An overlay metrology system is disclosed in accordance with one or more illustrative embodiments of the present disclosure. In one illustrative embodiment, the system includes a controller to be communicatively coupled with an overlay metrology tool. In another illustrative embodiment, the controller receives, from the overlay metrology tool configured with two or more hardware configurations, overlay measurements on a set of overlay targets distributed across a sample with a plurality of values of a measurement parameter for configuring the overlay metrology tool. In another illustrative embodiment, the controller determines scaling metric values for the set of overlay targets based on the overlay measurements with the two or more hardware configurations, where the scaling metric for a particular overlay target in the set of overlay target measured with a particular hardware configuration of the two or more hardware configurations is based on a standard deviation of the overlay measurements associated with the particular hardware configuration. In another illustrative embodiment, the controller determines a variability of the scaling metric values associated with each of the two or more hardware configurations. In another illustrative embodiment, the controller selects, as an output hardware configuration of the overlay metrology tool, one of the two or more hardware configurations having a smallest scaling metric variability, where the output hardware configuration is provided to the overlay metrology tool for measurement of one or more additional instances of the overlay target.

An overlay metrology system is disclosed in accordance with one or more illustrative embodiments of the present disclosure. In one illustrative embodiment, the system includes a controller to be communicatively coupled with an overlay metrology tool. In another illustrative embodiment, the controller receives a set of site-specific scaling factors to correct overlay inaccuracy at a set of overlay locations. In another illustrative embodiment, the site-specific scaling factors are generated based on overlay measurements of a set of reference overlay targets distributed at the set of overlay locations with a plurality of values of a measurement parameter, where the set of reference overlay targets have a common target design, and where the set of reference overlay targets include a known spatial distribution of fabrication errors. In another illustrative embodiment, the site-specific scaling factors are based on a standard deviation of the overlay measurements. In another illustrative embodiment, the controller receives, at least one test overlay measurement from at least one overlay target having the common target design located on at least one location in the set of overlay locations on a test sample. In another illustrative embodiment, the controller corrects at least one test overlay measurement with the corresponding site-specific scaling factor.

A method is disclosed in accordance with one or more illustrative embodiments of the present disclosure. In one illustrative embodiment, the method includes measuring, on a set of overlay targets distributed across a reference sample, overlay with a plurality of values of a measurement parameter for configuring an overlay metrology tool. In another illustrative embodiment, the set of overlay targets have a common target design and include a known spatial distribution of fabrication errors. In another illustrative embodiment, the method includes determining scaling metric values for the plurality of overlay targets based on the overlay measurements, where the scaling metric for a particular overlay target of the plurality of overlay targets is based on a standard deviation of the overlay measurements. In another illustrative embodiment, the method includes identifying a metrology recipe including a value of the measurement parameter providing an insensitivity to the fabrication errors within a selected tolerance based on a correlation between the scaling metric values and the measurement parameter. In another illustrative embodiment, the method includes measuring overlay on at least one overlay target having the common target design on a test sample with the identified metrology recipe.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1C is a conceptual view illustrating the overlay metrology tool, in accordance with one or more embodiments of the present disclosure.

DETAILED DESCRIPTION

Figure 1A:
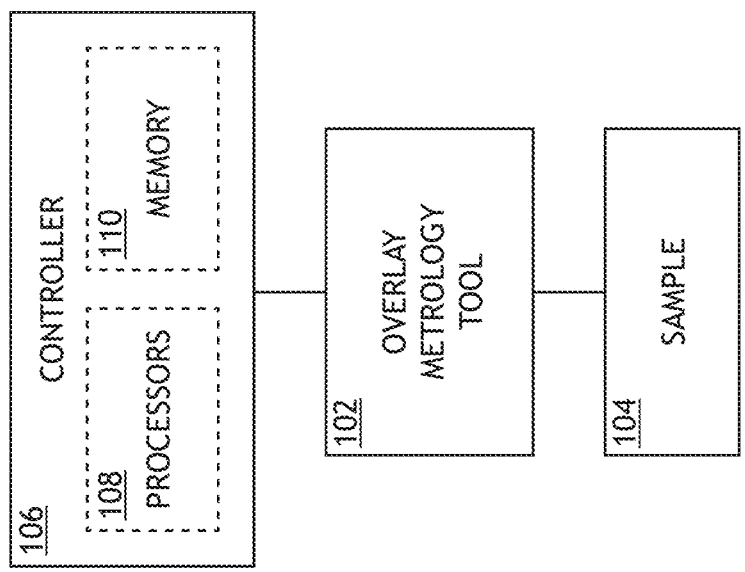
FIG. 1A is a conceptual view illustrating an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to evaluation of the robustness of overlay target designs and/or recipes for determining overlay based on a selected overlay target design.

It is recognized herein that a semiconductor device may be formed as multiple printed layers of patterned material on a substrate. Each printed layer may be fabricated through a series of process steps such as, but not limited to, one or more material deposition steps, one or more lithography steps, or one or more etching steps. Further, each printed layer must typically be fabricated within selected tolerances to properly construct the final device. For example, the relative placement of printed elements in each layer (e.g., the overlay) must be well characterized and controlled with respect to previously fabricated layers. Accordingly, metrology targets may be fabricated on one or more printed layers to enable efficient characterization of the overlay of the layers. Deviations of overlay target features on a printed layer may thus be representative of deviations of printed characteristics of printed device features on that layer. Further, overlay measured at one fabrication step (e.g., after the fabrication of one or more sample layers) may be used to generate correctables for precisely aligning a process tool (e.g., a lithography tool, or the like) for the fabrication of an additional sample layer in a subsequent fabrication step.

Overlay metrology is typically performed by fabricating one or more overlay targets across a sample, where each overlay target includes features in sample layers of interest, which are fabricated at the same time as features associated with a device or component being fabricated. In this regard, overlay errors measured at a location of an overlay target may be representative of overlay errors of device features. Accordingly, overlay measurements may be used to monitor and/or control any number of fabrication tools to maintain production of devices according to specified tolerances. For example, overlay measurements of a current layer with respect to a previous layer on one sample may be utilized as feed-back data to monitor and/or mitigate deviations of the fabrication of the current layer on additional samples within a lot. By way of another example, overlay measurements of a current layer with respect to a previous layer on one sample may be utilized as feed-forward data to fabricate a subsequent layer on the same sample in a way that takes into account the existing layer alignments.

Overlay targets typically include features specifically designed to be sensitive to overlay errors between sample layers of interest. An overlay measurement may then be carried out by characterizing the overlay target using an overlay metrology tool and applying an algorithm to determine overlay errors on the sample based on the output of the metrology tool.

Overlay metrology tools may utilize a variety of techniques to determine the overlay of sample layers. For example, image-based overlay metrology tools may illuminate an overlay target (e.g., an advanced imaging metrology (AIM) target, a box-in-box metrology target, or the like) and capture an overlay signal including an image of overlay target features located on different sample layers. Accordingly, overlay may be determined by measuring the relative positions of the overlay target features. By way of another example, scatterometry-based overly metrology tools may illuminate an overlay target (e.g., a grating-over-grating metrology target, or the like) and capture an overlay signal including an angular distribution of radiation emanating from the overlay target associated with diffraction, scattering, and/or reflection of the illumination beam. Accordingly, overlay may be determined based on models of the interaction of an illumination beam with the overlay target.

Regardless of the overlay measurement technique, an overlay metrology tool is typically configurable according to a recipe including a set of measurement parameters utilized to generate an overlay signal. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like. Accordingly, an overlay recipe may include a set of measurement parameters for generating an overlay signal suitable for determining overlay of two or more sample layers.

The accuracy and/or the repeatability of an overlay measurement may depend on the overlay recipe as well as a wide range of factors associated with the particular geometry of the overlay target such as, but not limited to, thicknesses of sample layers, the sizes of overlay target features, the density or pitch of overlay target features, or the composition of sample layers. Further, the particular geometry of overlay targets may vary across the sample in both predictable and unpredictable manners. For example, the thicknesses of fabricated layers may vary across the sample in a known distribution (e.g., a thickness may be expected to be slightly larger in the center of a sample than along an edge) or may vary according to random fluctuations associated with defects or random variations of processing steps. Accordingly, a particular overlay recipe may not provide the same accuracy and/or repeatability when applied to all overlay targets of a sample, even if process variations are within selected fabrication tolerances.

An overlay measurement using a given algorithm is typically performed under an assumption that the overlay target includes perfectly symmetric features developed on perfectly uniform sample layers formed from perfectly uniform materials. However, process variations associated with fabrication of an overlay target may introduce deviations of a fabricated overlay target from designed characteristics (e.g., sidewall asymmetries, or the like). For example, process variations may include variations in the deposition of film layers, the exposure of patterns on film layers, etching the exposed patterns on the film layers, and the like. In this regard, any impact of deviations of a fabricated overlay target from designed characteristics on the measured signal may be improperly attributed to overlay error and may thus manifest as inaccuracies in the overlay measurement.

Further, it may be the case that, for a given overlay target and a given overlay algorithm, different metrology recipes (e.g., different configurations of the overlay metrology tool) may exhibit different sensitivity to process errors. Put another way, it may be possible to identify particular measurement recipes (e.g., particular values of wavelength, polarization, or the like used by an overlay metrology tool to characterize an overlay target) that are relatively robust to process variations associated with fabrication of a particular overlay target. In this regard, robust and accurate overlay measurements may be achieved.

Inaccuracy associated with overlay metrology may be generally described as:

$$\text{Overlay}_{measured} = \epsilon + \delta N \quad (1)$$

where $\epsilon$ is the physical overlay error (e.g., an alignment error of one sample layer to another). Further, the inaccuracy may be defined as a function of a measurement parameter (e.g., associated with a measurement recipe). For example, overlay inaccuracy may be generally described as a function of wavelength:

$$\text{Overlay}_{measured}(\lambda) = \epsilon + \delta N \quad (2)$$

In one embodiment, an overlay target is evaluated using a scaling metric (S-metric) that is sensitive to deviations of a fabricated overlay target from design characteristics induced by process variations. In this regard, the S-metric may be used to evaluate the robustness of a metrology recipe applied to a particular target. For example, the S-metric may be generated based on overlay measurements of a target under different measurement parameters (e.g., different metrology recipes).

It is contemplated herein that the S-metric may be used in various ways to facilitate robust overlay metrology. In one embodiment, the S-metric may facilitate the selection of various aspects of a metrology recipe (e.g., wavelength, polarization, or the like) to provide robust measurements on a particular overlay target, even in the presence of process variations across the sample. For example, a robust measurement recipe may be characterized as one that provides $\delta N \rightarrow 0$ (e.g., see Eq. (1)) for a range of likely process variations.

In another embodiment, the S-metric is evaluated for multiple instances of an overlay target located at different locations across the sample. In this regard, the S-metric may facilitate tuning of the metrology recipe based on the target location. For example, the S-metric may be evaluated for multiple instances of an overlay target across a sample with known spatially-varying process variations to evaluate the robustness of the overlay measurement. Further, robustness may be evaluated using any metric. For example, it may be the case that the overlay inaccuracy is small (e.g., $\delta N \rightarrow 0$) over a range of process variations such that the overlay measurements are free of systematic errors and are further insensitive to process variations in this range. By way of another example, it may be the case that the overlay inaccuracy does not approach zero, but is relatively stable over a range of process variations (e.g., $\text{var}(\delta N) \rightarrow 0$). In this regard, the overlay measurement may be relatively robust, yet may suffer from systematic errors. In either case, the S-metric may facilitate the selection of a metrology recipe within selected design criteria.

In another embodiment, the S-metric may be evaluated for multiple overlay targets having different designs and/or different overlay measurement algorithms to evaluate the relative robustness of the targets and/or algorithms under consideration. In this regard, the S-metric may facilitate selection of a robust overlay target and/or measurement algorithm.

For the purposes of the present disclosure, an overlay signal associated with an overlay metrology tool may be considered to be an output of the overlay metrology tool having sufficient information to determine an overlay including relative positions of overlay target features on two or more sample layers (e.g., through analysis using one or more processors, or the like). For example, an overlay signal may include, but is not required to include, one or more datasets, one or more images, one or more detector readings, or the like.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating an overlay metrology system 100, in accordance with one or more embodiments of the present disclosure.

In one embodiment, the overlay metrology system 100 includes an overlay metrology tool 102 to acquire overlay signals from overlay targets based on any number of recipes. For example, the overlay metrology tool 102 may direct illumination to a sample 104 and may further collect radiation emanating from the sample 104 to generate an overlay signal suitable for the determination of overlay of two or more sample layers. The overlay metrology tool 102 may be any type of overlay metrology tool known in the art suitable for generating overlay signals suitable for determining overlay associated with overlay targets on a sample 104. The overlay metrology tool 102 may operate in an imaging mode or a non-imaging mode. For example, in an imaging mode, individual overlay target elements may be resolvable within the illuminated spot on the sample (e.g., as part of a bright-field image, a dark-field image, a phase-contrast image, or the like). By way of another example, the overlay metrology tool 102 may operate as a scatterometry-based overlay metrology tool in which radiation from the sample is analyzed at a pupil plane to characterize the angular distribution of radiation from the sample 104 (e.g., associated with scattering and/or diffraction of radiation by the sample 104).

Further, the overlay tool may be configurable to generate overlay signals based on any number of recipes defining measurement parameters for the acquiring an overlay signal suitable for determining overlay of an overlay target. For example, a recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

In another embodiment, the overlay metrology system 100 includes a controller 106 communicatively coupled to the overlay metrology tool 102. The controller 106 may be configured to direct the overlay metrology tool 102 to generate overlay signals based on one or more selected recipes. The controller 106 may be further configured to receive data including, but not limited to, overlay signals from the overlay metrology tool 102. Additionally, the controller 106 may be configured to determine overlay associated with an overlay target based on the acquired overlay signals.

In another embodiment, the controller 106 includes one or more processors 108. For example, the one or more processors 108 may be configured to execute a set of program instructions maintained in a memory device 110, or memory. The one or more processors 108 of a controller 106 may include any processing element known in the art. In this sense, the one or more processors 108 may include any microprocessor-type device configured to execute algorithms and/or instructions. Further, the memory device 110 may include any storage medium known in the art suitable for storing program instructions executable by the associated one or more processors 108. For example, the memory device 110 may include a non-transitory memory medium. As an additional example, the memory device 110 may include, but is not limited to, a read-only memory, a random access memory, a magnetic or optical memory device (e.g., disk), a magnetic tape, a solid state drive and the like. It is further noted that memory device 110 may be housed in a common controller housing with the one or more processors 108.

Figure 1B:
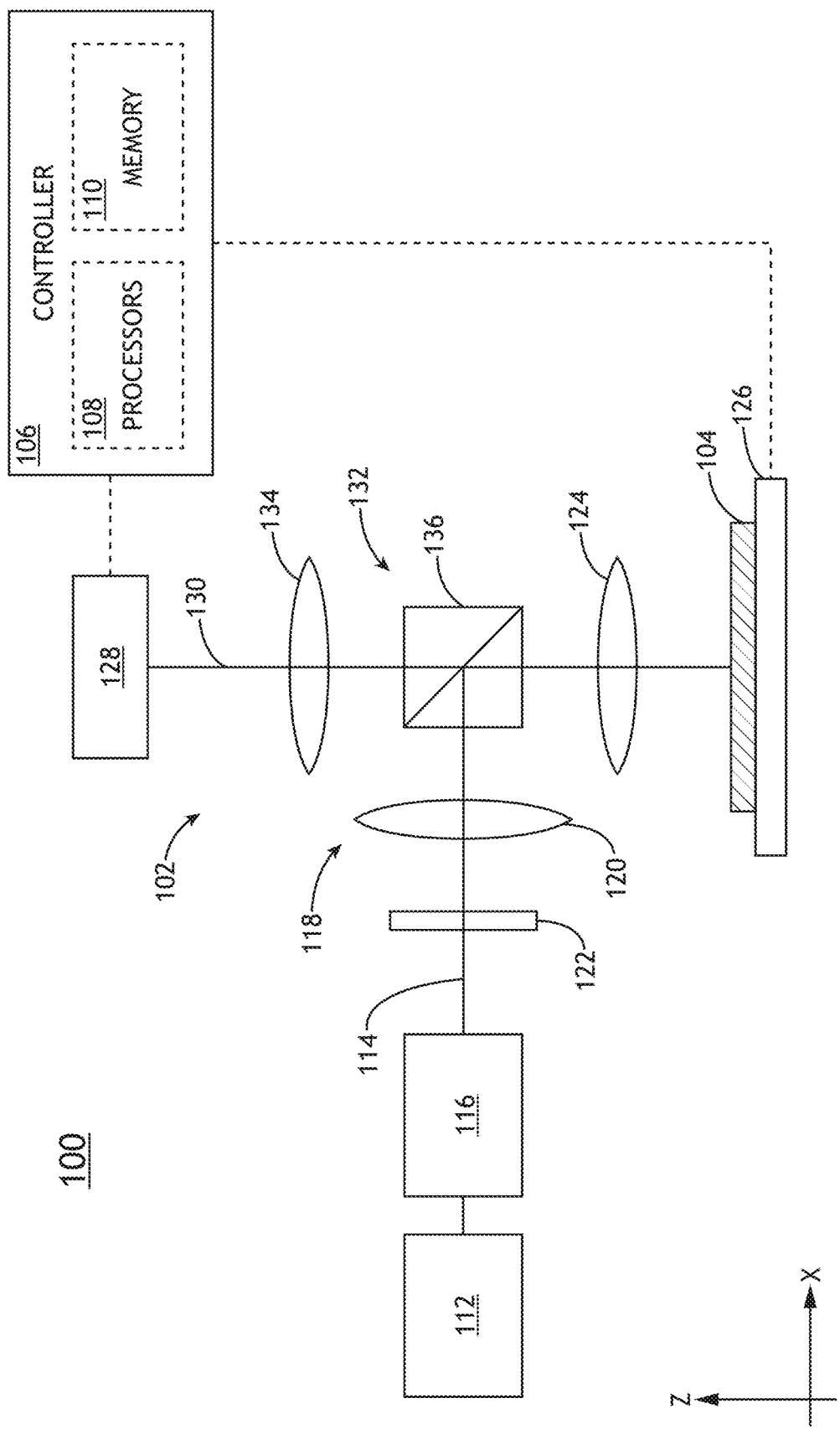
FIG. 1B is a conceptual view illustrating the overlay metrology tool, in accordance with one or more embodiments of the present disclosure.

FIG. 1B is a conceptual view illustrating the overlay metrology tool 102, in accordance with one or more embodiments of the present disclosure. In one embodiment, the overlay metrology tool 102 includes an illumination source 112 configured to generate an illumination beam 114. The illumination beam 114 may include one or more selected wavelengths of light including, but not limited to, ultraviolet (UV) radiation, visible radiation, or infrared (IR) radiation.

The illumination source 112 may include any type of illumination source suitable for providing an illumination beam 114. In one embodiment, the illumination source 112 is a laser source. For example, the illumination source 112 may include, but is not limited to, one or more narrowband laser sources, a broadband laser source, a supercontinuum laser source, a white light laser source, or the like. In this regard, the illumination source 112 may provide an illumination beam 114 having high coherence (e.g., high spatial coherence and/or temporal coherence). In another embodiment, the illumination source 112 includes a laser-sustained plasma (LSP) source. For example, the illumination source 112 may include, but is not limited to, a LSP lamp, a LSP bulb, or a LSP chamber suitable for containing one or more elements that, when excited by a laser source into a plasma state, may emit broadband illumination. In another embodiment, the illumination source 112 includes a lamp source. For example, the illumination source 112 may include, but is not limited to, an arc lamp, a discharge lamp, an electrodeless lamp, or the like. In this regard, the illumination source 112 may provide an illumination beam 114 having low coherence (e.g., low spatial coherence and/or temporal coherence).

In another embodiment, the overlay metrology system 100 includes a wavelength selection device 116 to control the spectrum of the illumination beam 114 for illumination of the sample 104. For example, the wavelength selection device 116 may include a tunable filter suitable for providing an illumination beam 114 with a selected spectrum (e.g., center wavelength, bandwidth, spectral profile, or the like). By way of another example, the wavelength selection device 116 may adjust one or more control settings of a tunable illumination source 112 to directly control the spectrum of the illumination beam 114. Further, the controller 106 may be communicatively coupled to the illumination source 112 and/or the wavelength selection device 116 to adjust one or more aspects of the spectrum of the illumination beam 114.

In another embodiment, the overlay metrology tool 102 directs the illumination beam 114 to the sample 104 via an illumination pathway 118. The illumination pathway 118 may include one or more optical components suitable for modifying and/or conditioning the illumination beam 114 as well as directing the illumination beam 114 to the sample 104. For example, the illumination pathway 118 may include, but is not required to include, one or more lenses 120 (e.g., to collimate the illumination beam 114, to relay pupil and/or field planes, or the like), one or more polarizers 122 to adjust the polarization of the illumination beam 114, one or more filters, one or more beam splitters, one or more diffusers, one or more homogenizers, one or more apodizers, one or more beam shapers, or one or more mirrors (e.g., static mirrors, translatable mirrors, scanning mirrors, or the like). In another embodiment, the overlay metrology tool 102 includes an objective lens 124 to focus the illumination beam 114 onto the sample 104 (e.g., an overlay target with overlay target elements located on two or more layers of the sample 104). In another embodiment, the sample 104 is disposed on a sample stage 126 suitable for securing the sample 104 and further configured to position the sample 104 with respect to the illumination beam 114.

In another embodiment, the overlay metrology tool 102 includes one or more detectors 128 configured to capture radiation emanating from the sample 104 (e.g., an overlay target on the sample 104) (e.g., sample radiation 130) through a collection pathway 132 and generate one or more overlay signals indicative of overlay of two or more layers of the sample 104. The collection pathway 132 may include multiple optical elements to direct and/or modify illumination collected by the objective lens 124 including, but not limited to one or more lenses 134, one or more filters, one or more polarizers, one or more beam blocks, or one or more beamsplitters. For example, a detector 128 may receive an image of the sample 104 provided by elements in the collection pathway 132 (e.g., the objective lens 124, the one or more lenses 134, or the like). By way of another example, a detector 128 may receive radiation reflected or scattered (e.g., via specular reflection, diffuse reflection, and the like) from the sample 104. By way of another example, a detector 128 may receive radiation generated by the sample (e.g., luminescence associated with absorption of the illumination beam 114, and the like). By way of another example, a detector 128 may receive one or more diffracted orders of radiation from the sample 104 (e.g., 0-order diffraction, ±1 order diffraction, ±2 order diffraction, and the like).

The illumination pathway 118 and the collection pathway 132 of the overlay metrology tool 102 may be oriented in a wide range of configurations suitable for illuminating the sample 104 with the illumination beam 114 and collecting radiation emanating from the sample 104 in response to the incident illumination beam 114. For example, as illustrated in FIG. 1B, the overlay metrology tool 102 may include a beamsplitter 136 oriented such that the objective lens 124 may simultaneously direct the illumination beam 114 to the sample 104 and collect radiation emanating from the sample 104. By way of another example, the illumination pathway 118 and the collection pathway 132 may contain non-overlapping optical paths.

FIG. 1C is a conceptual view illustrating an overlay metrology tool 102, in accordance with one or more embodiments of the present disclosure. In one embodiment, the illumination pathway 118 and the collection pathway 132 contain separate elements. For example, the illumination pathway 118 may utilize a first focusing element 138 to focus the illumination beam 114 onto the sample 104 and the collection pathway 132 may utilize a second focusing element 140 to collect radiation from the sample 104. In this regard, the numerical apertures of the first focusing element 138 and the second focusing element 140 may be different. In another embodiment, one or more optical components may be mounted to a rotatable arm (not shown) pivoting around the sample 104 such that the angle of incidence of the illumination beam 114 on the sample 104 may be controlled by the position of the rotatable arm.

As described previously herein, the overlay metrology tool 102 may be configurable to generate overlay signals associated with overlay targets on the sample 104 using any number of overlay recipes (e.g., sets of measurement parameters). Further, the overlay metrology tool 102 may provide rapid tuning of the measurement parameters such that multiple overlay signals based on different recipes may be rapidly acquired. For example, the controller 106 of the overlay metrology system 100 may be communicatively coupled with one or more adjustable components of the overlay metrology tool 102 to configure the adjustable components in accordance with an overlay recipe.

An overlay recipe may include one or more aspects of the spectrum of the illumination beam 114 incident on the sample such as, but not limited to the wavelength (e.g., the central wavelength), the bandwidth, and the spectral profile of the illumination beam 114 as measurement parameters. For example, the controller 106 may be communicatively coupled to the illumination source 112 and/or the wavelength selection device 116 to adjust the spectrum of the illumination beam 114 in accordance with an overlay recipe.

In one embodiment, the wavelength selection device 116 includes one or more position-tunable spectral filters in which spectral characteristics of an incident illumination beam 114 (e.g., a center wavelength, a bandwidth, a spectral transmissivity value or the like) may be rapidly tuned by modifying the position of the illumination beam 114 on the filter. Further, position-tunable spectral filters may include any type of spectral filter such as, but not limited to, a low-pass filter, a high-pass filter, a band-pass filter, or a band-reject filter.

For example, a position-tunable spectral filter may include one or more thin films operating as an edge filter with a position-tunable cutoff wavelength. In this regard, the cutoff wavelength may be tuned by modifying the position of the illumination beam 114 on the filter. For instance, a low-pass edge filter may pass (e.g., via transmission or reflection) wavelengths below the cutoff wavelength, whereas a high-pass edge filter may pass wavelengths above the cutoff wavelength. Further, a band-pass filter may be formed from a low-pass edge filter combined with a high-pass edge filter.

Referring now to FIGS. 2 through 10, a scaling metric (S-metric) for evaluating the sensitivity of an overlay metrology target to process variations is described in greater detail.

As described previously herein, process variations during the fabrication of an overlay metrology target (and the associated device features) may result in deviations of a fabricated overlay target from design characteristics. For example, process variations in a film deposition step may result in variations in characteristics of a sample layer such as, but not limited to, thickness, homogeneity, or refractive index. By way of another example, variations in an exposure step may include deviations of an exposed pattern of elements from a designed pattern. By way of another example, variations in an etching step may result in deviations of fabricated features from the exposed pattern such as, but not limited to, side-wall angle asymmetry.

The impacts of process variations on overlay targets may generally be divided into two categories: asymmetric variations and symmetric variations. Asymmetric variations are characterized by an asymmetry in one or more elements of an overlay target or of the overlay target as a whole. Examples of asymmetric process variations include, but are not limited to, asymmetric sidewall angles, deformations of grating structures, or target noise. In contrast, symmetric variations include symmetric physical deviations of a fabricated overlay target from design characteristics and may include, but are not limited to, variations of the optical properties or thickness of one or more sample layers.

It is contemplated herein that regions of low measurability (e.g., regions of low contrast in imaging-based overlay or regions of low sensitivity in scatterometry-based overlay) may suffer from a strong amplification of overlay inaccuracy, including inaccuracy induced by process variations. However, different types of inaccuracy may have different impacts. For example, asymmetric variations in an overlay target may lead to amplification of the inaccuracy error, while symmetric variations in an overlay target may change the recipe performance and/or robustness of the recipe.

It is further contemplated herein that the sensitivity of an overlay measurement algorithm to deviations of an overlay target induced by process variations may depend on the precise values of measurement parameters of an overlay metrology tool (e.g., the overlay metrology system 100) such as, but not limited to, a wavelength or polarization of illumination of the overlay target.

Figure 2:
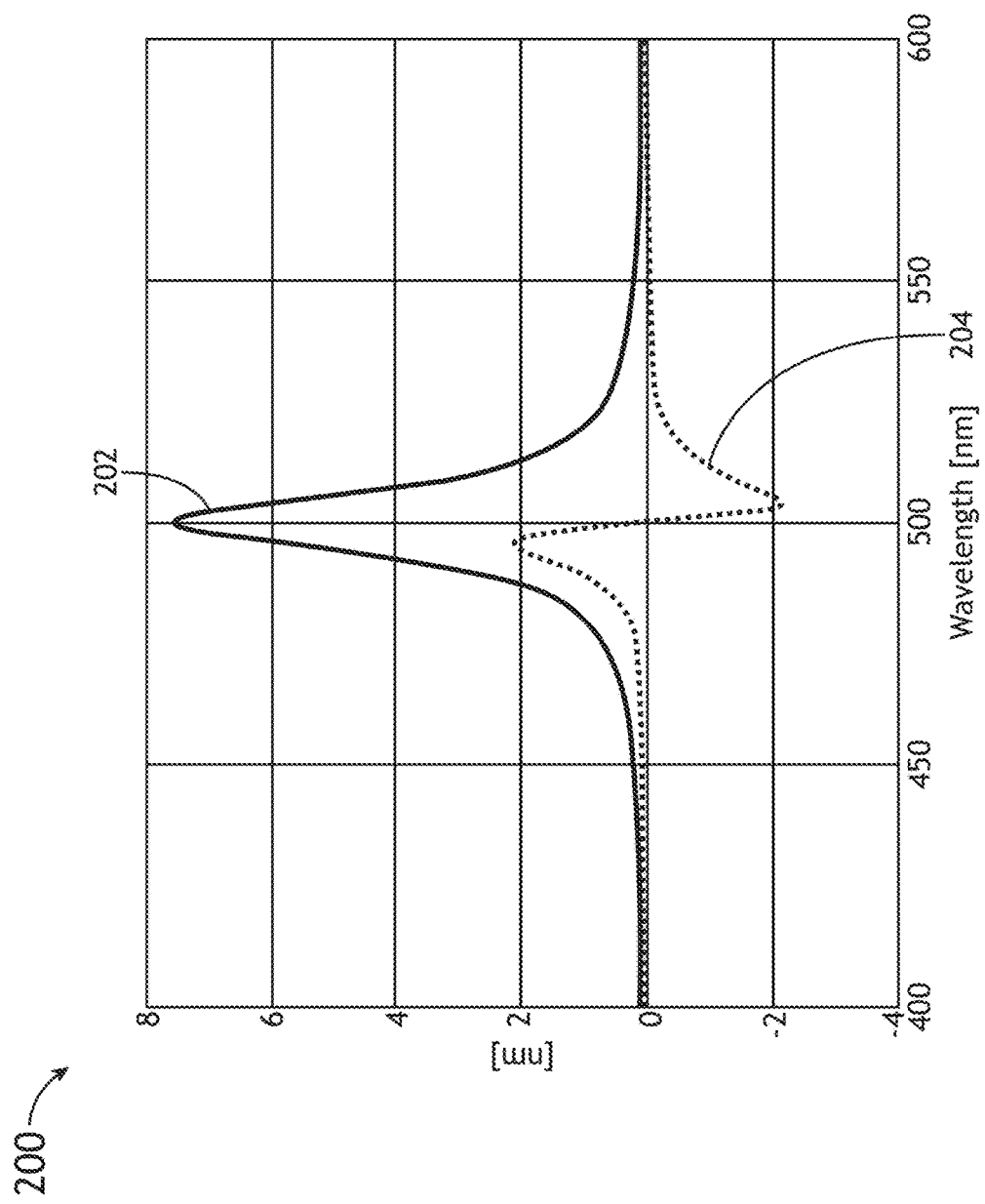
FIG. 2 is a plot of the contrast precision and inaccuracy as a function of wavelength for a target with asymmetric sidewall angles induced by process variations, in accordance with one or more embodiments of the present disclosure.

FIG. 2 is a plot 200 of the contrast precision 202 and inaccuracy 204 as a function of wavelength for a target with asymmetric sidewall angles induced by process variations, in accordance with one or more embodiments of the present disclosure. As illustrated in FIG. 2, in a region of poor contrast precision, peaking here at 500 nm, there exists a concurrent amplification of the inaccuracy. In contrast, the impact of sidewall angle inaccuracy is low at 400 nm and 600 nm. Accordingly, the overlay measurement is relatively insensitive to the process variations at 400 nm and 600 nm and is therefore robust at these wavelengths.

Figure 3A:
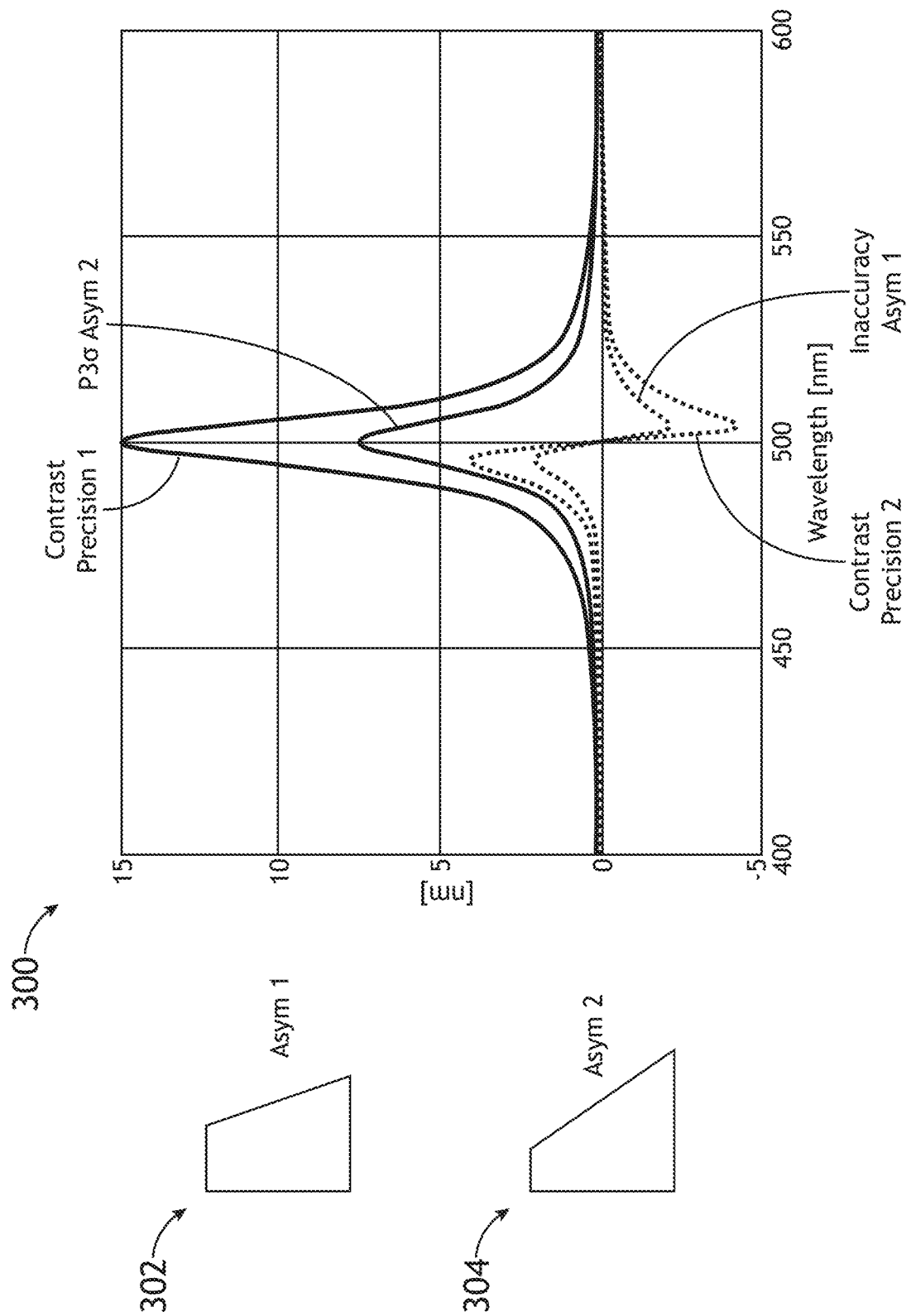
FIG. 3A is a plot illustrating the impact of the strength of sidewall asymmetry on the overlay inaccuracy, in accordance with one or more embodiments of the present disclosure.
Figure 3B:
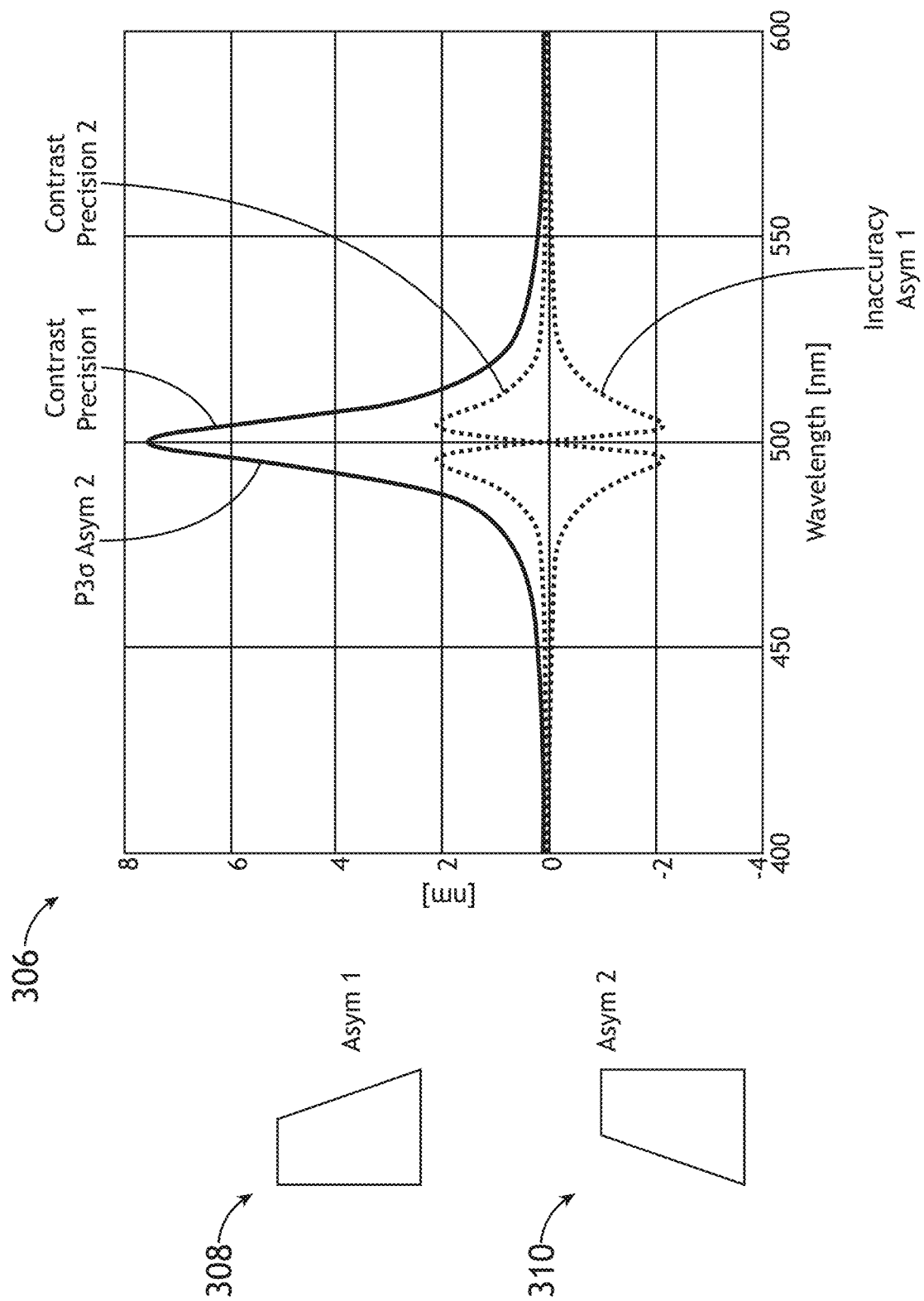
FIG. 3B is a plot illustrating the impact of the sign of sidewall asymmetry on the overlay inaccuracy, in accordance with one or more embodiments of the present disclosure.

Additionally, the strength and the sign of a process-variation-induced asymmetry of an overlay target, or element thereof, may have different impacts on the overlay inaccuracy. FIG. 3A is a plot 300 illustrating the impact of the strength of sidewall asymmetry on the overlay inaccuracy, in accordance with one or more embodiments of the present disclosure. In FIG. 3A, two structures with different amounts of asymmetry are considered: Asym1 302 and Asym2 304, where Asym2 304 has a stronger asymmetry of sidewall angles. As illustrated in plot 300, an increase in the strength of the sidewall angle asymmetry results in an increase of the overlay inaccuracy in a region of low contrast precision (here at 500 nm). FIG. 3B is a plot 306 illustrating the impact of the sign of sidewall asymmetry on the overlay inaccuracy, in accordance with one or more embodiments of the present disclosure. In FIG. 3B, two structures with different amounts of asymmetry are considered: Asym1 308 and Asym2 310, where Asym1 308 and Asym2 310 have opposite signs of the sidewall angle asymmetry. As illustrated in plot 306, a flip in the sign of the asymmetry results in a flip of the inaccuracy behavior around the region of low contrast precision (here at 500 nm), but no change in strength.

Figure 4A:
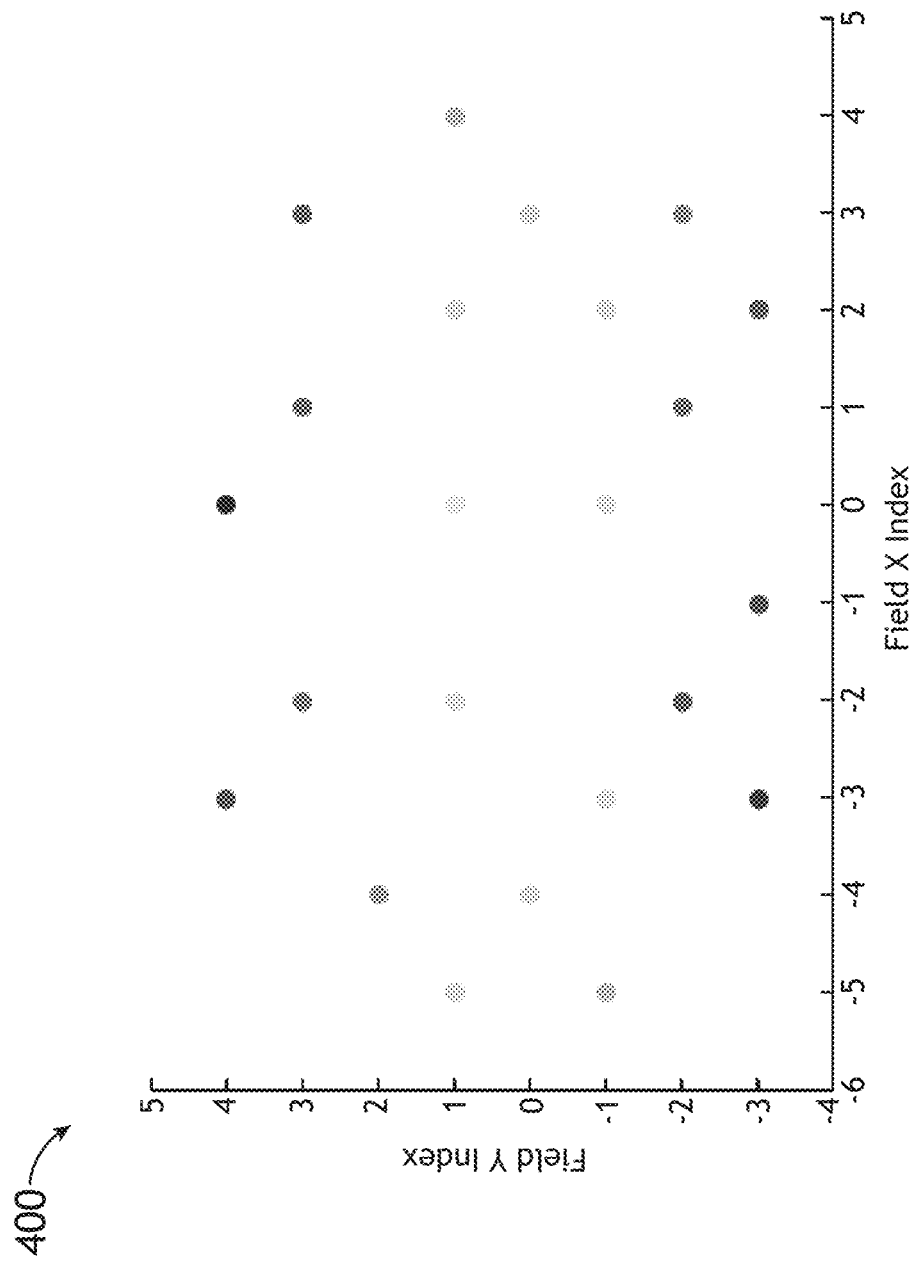
FIG. 4A is a plot of locations of overlay targets distributed across a sample, in accordance with one or more embodiments of the present disclosure.
Figure 4B:
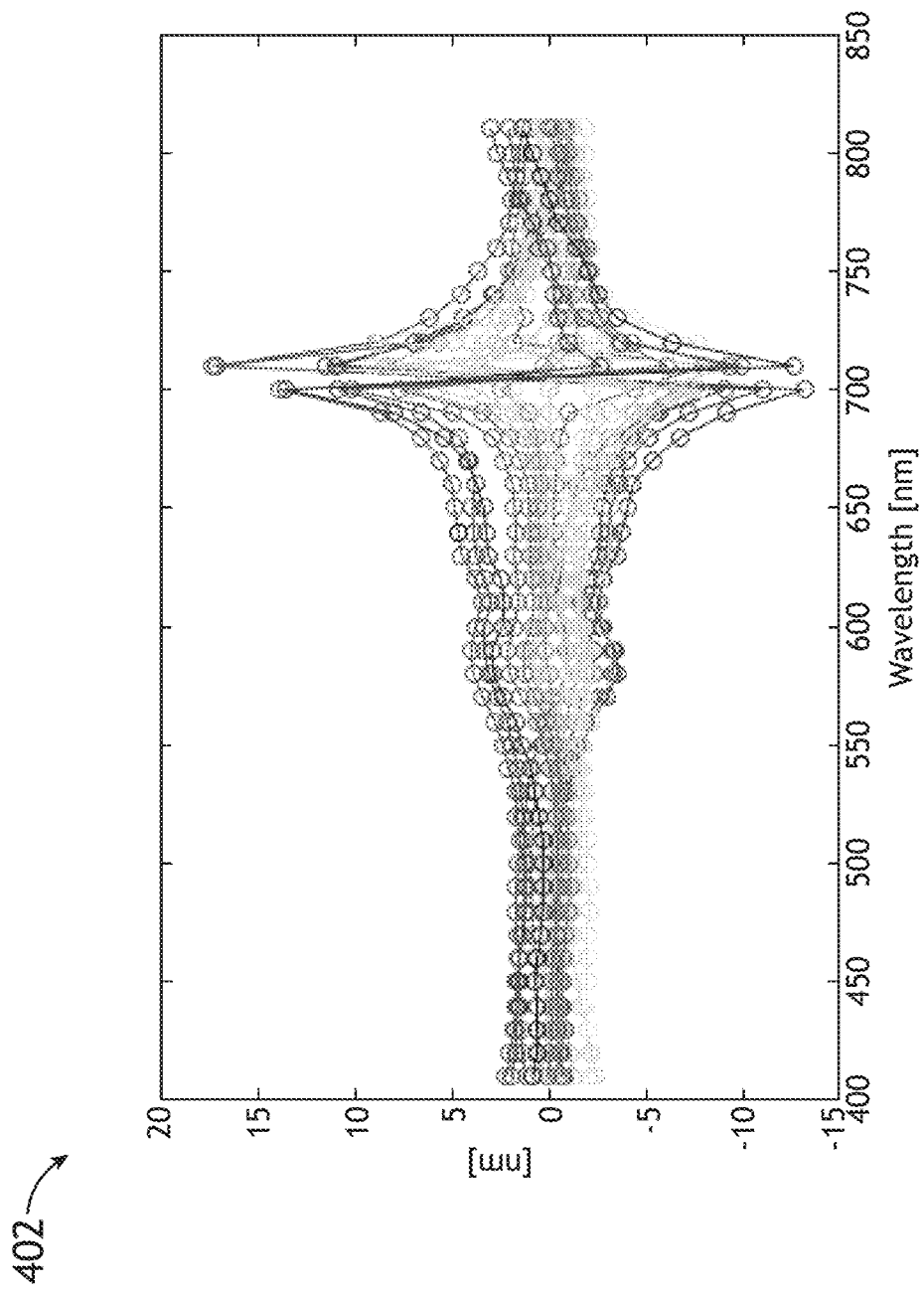
FIG. 4B is a plot of measured overlay as a function of wavelength for the overlay targets depicted in FIG. 4A, in accordance with one or more embodiments of the present disclosure.

Referring now to FIGS. 4A and 4B, the spatial distribution of process variations and their associated impact on overlay inaccuracy across a sample is described in greater detail. Since process variations are generally the result of mechanical and/or optical effects, different process variations typically have defined signatures associated with a spatial distribution of the sign and/or magnitude of induced asymmetries on overlay targets across a sample. For example, the effect of etch on a sample (e.g., a wafer) usually contains a radial signature due to the electron beam, which results in increasing side wall angle asymmetry (e.g., in fabricated grating structures) from the center of the wafer to the periphery of the sample. Based on FIGS. 3A and 3B, this may lead to better accuracy in the center of a sample and increasing inaccuracy toward the sample periphery. By way of another example, the effect of variations in film deposition typically also results in a radial thickness variation of the thin film, which may induce a similar inaccuracy signature across the sample.

FIG. 4A is a plot 400 of locations of overlay targets distributed across a sample, in accordance with one or more embodiments of the present disclosure. FIG. 4B is a plot 402 of measured overlay as a function of wavelength for the overlay targets depicted in FIG. 4A, in accordance with one or more embodiments of the present disclosure. In FIGS. 4A and 4B, overlay targets near the center of the sample, shown as relatively light shades, exhibit relatively low resonance around 720 nm, whereas overlay targets near the periphery of the sample, shown as relatively dark shades, exhibit relatively high resonance around 720 nm. In this regard, the overlay algorithm has a relatively high $\delta N$ (see Equations (1)

and (2) above). Further, there exists a sign inversion between the overlay measurements on the top and bottom of the sample (based on the Field Y values in FIG. 4A), which indicates a sign flipping of the physical geometrical asymmetry within the overlay target as a result of process variations.

Further, FIGS. 4A and 4B illustrate that the overlay algorithm is relatively insensitive to the process variations at wavelengths in the range of approximately 400-500 nm, which is indicated by the high stability of the overlay measurement signature in this wavelength region. Accordingly, overlay measurements in this wavelength region may generally be more accurate across the sample. For wavelengths in the range of approximately 500-600 nm, the overlay measurements tend to scale with the strength of the asymmetry, which indicates a higher sensitivity to process variation and therefore greater inaccuracy for measurements in this wavelength region.

Figure 5A:
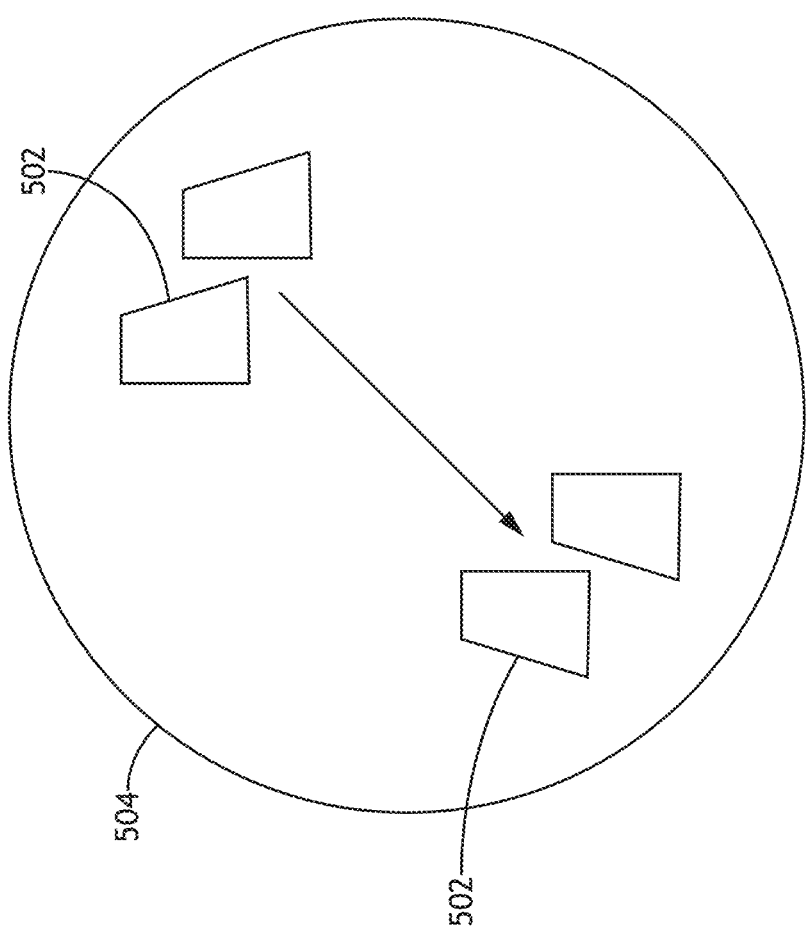
FIG. 5A is a schematic representation of a distribution of process-variation-induced asymmetry on features of an overlay target, in accordance with one or more embodiments of the present disclosure.
Figure 5B:
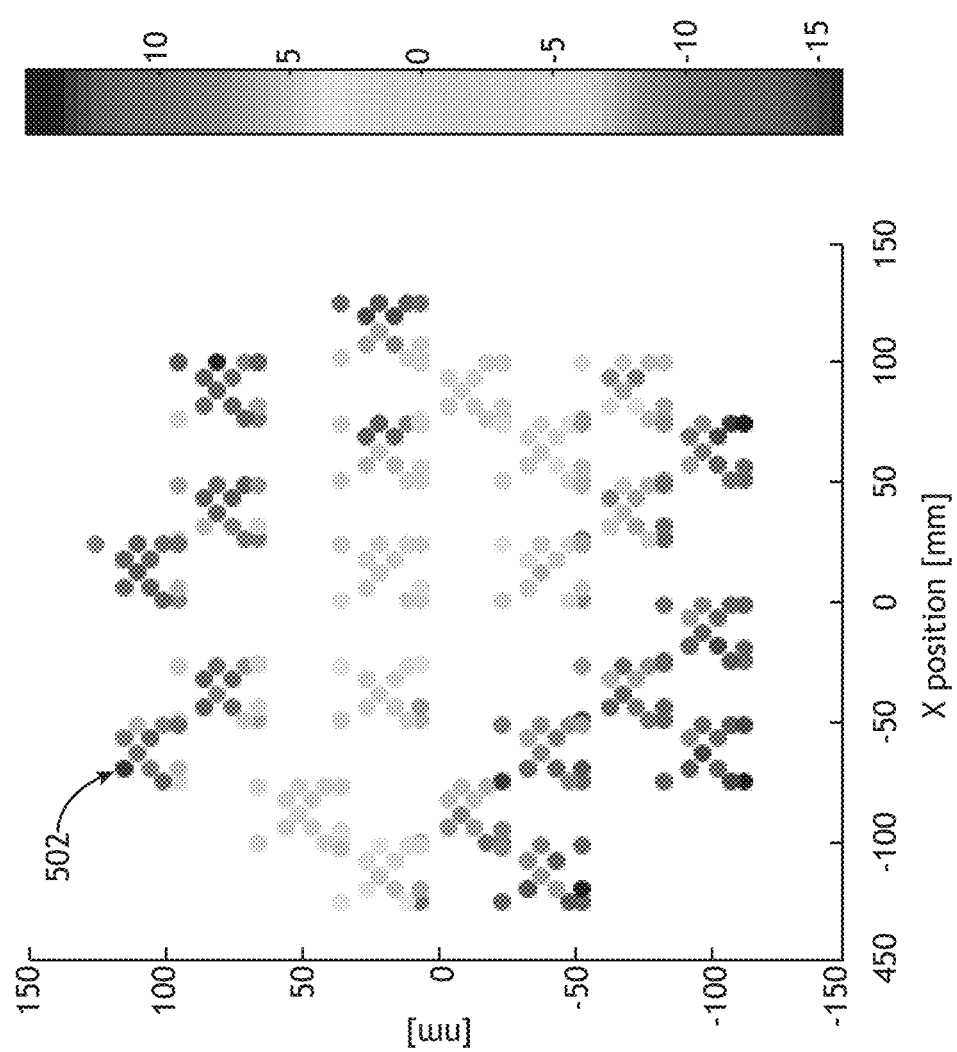
FIG. 5B is a simulated representation of overlay targets distributed across the sample depicted in FIG. 5A, where the shading of each overlay target represents the value of the S-metric, in accordance with one or more embodiments of the present disclosure.

Referring now to FIGS. 5A and 5B, a scaling metric (S-metric) for evaluating the robustness of an overlay target and/or algorithm are described in greater detail.

It is contemplated herein that a metric may be developed that evaluates the robustness (or alternatively the sensitivity) of an overlay measurement of a particular overlay target using a particular overlay algorithm. In one embodiment, an S-metric as disclosed herein evaluates any variations of overlay measurements of a particular overlay target using a particular overlay algorithm in the presence of process variations as a function of measurement parameters (e.g., parameters of a metrology recipe) such as, but not limited to, wavelength or polarization. In this regard, a sensitivity to process variations may manifest as variability of the measured overlay (or overlay inaccuracy) as illustrated in FIGS. 2-5B. For example, FIGS. 2-3B above illustrate that a single overlay measurement in the presence of a process-variation-induced deviation of an overlay target is insufficient to distinguish the impact of the process variation on the overlay measurement. However, evaluating the overlay measurement (or the overlay inaccuracy) across a range of measurement parameters (e.g., wavelength in the case of FIGS. 2-3B) may allow the impact of the process variation on the overlay measurement to be determined.

In one embodiment, the S-metric is calculated as:

$$S_{metric} = \chi \cdot \sqrt{\Sigma_{i=1}^N w_i(ovl_i - \langle ovl \rangle)^2} \quad (3)$$

with $$\langle ovl \rangle = \Sigma_{i=1}^N w_i ovl_i \quad (4)$$

where N is the number of measurements using a different measurement parameter (e.g., wavelength, polarization, or the like), i is the measurement parameter index, $ovl_i$ is the value of an overlay measurement for a given measurement parameter, $\langle ovl \rangle$ is a weighted average of the N overlay measurements, and w is a weight for each measurement. Further, $\chi$ may take the value of ±1 and may correspond to a sign of a resonance (e.g., a sign of an asymmetry). For example, the sign of $\chi$ may be determined by taking the sign of the difference between an overlay measurement at or near a resonance and an overlay measurement far from the resonance.

In a general sense, the S-metric is based on a weighted standard deviation of the overlay measurements across a range of values of a measurement parameter. In this regard, the S-metric may provide a measure of the variability of the overlay measurements across the range of measurement parameters.

It is contemplated herein that the formulation of the S-metric in Equations (3) and (4) provides substantial flexibility for implementation. For example, the absolute value of the S-metric may be of particular interest in applications where the particular sign of the S-metric (e.g., the value of $\chi$) may be disregarded. By way of another example, the overlay variability over the different measurements may be evaluated using different methods (e.g., the standard deviation weighted or not, integral, and the like).

In one embodiment, the weights w are determined based on a selected quality metric associated with the overlay measurements such as, but not limited to, contrast (e.g., in image-based overlay), sensitivity (e.g., in scatterometry-based overlay). In this regard, the impact of noise may be mitigated. In another embodiment, the weights w are all set to be equal (e.g., 1) to provide an unweighted metric.

FIG. 5A is a schematic representation of a distribution of process-variation-induced asymmetry on features of an overlay target, in accordance with one or more embodiments of the present disclosure. In FIG. 5A, features of overlay targets 502 near the center of a sample 504 may have relatively little to no asymmetry. However, features of overlay targets 502 exhibit increasingly strong sidewall angle asymmetry of one sign in positions progressing towards the upper right portion of the sample (in the orientation of FIG. 5A) and increasingly strong sidewall angle asymmetry of an opposite sign in positions progressing towards the lower left portion of the sample. FIG. 5B is a simulated representation of overlay targets 502 distributed across the sample 504 depicted in FIG. 5A, where the shading of each overlay target 502 represents the value of the S-metric, in accordance with one or more embodiments of the present disclosure.

As illustrated in FIG. 5B, the S-metric of overlay targets distributed across a sample 504 in the presence of process variations (here, sidewall angle asymmetry) allows for an evaluation of the sensitivity of the overlay landscape (an overlay algorithm applied to an overlay target over a range of measurement recipe parameters).

Referring now to FIGS. 6 through 10, the S-metric may be applied in numerous ways to facilitate accurate and robust overlay metrology.

Figure 6:
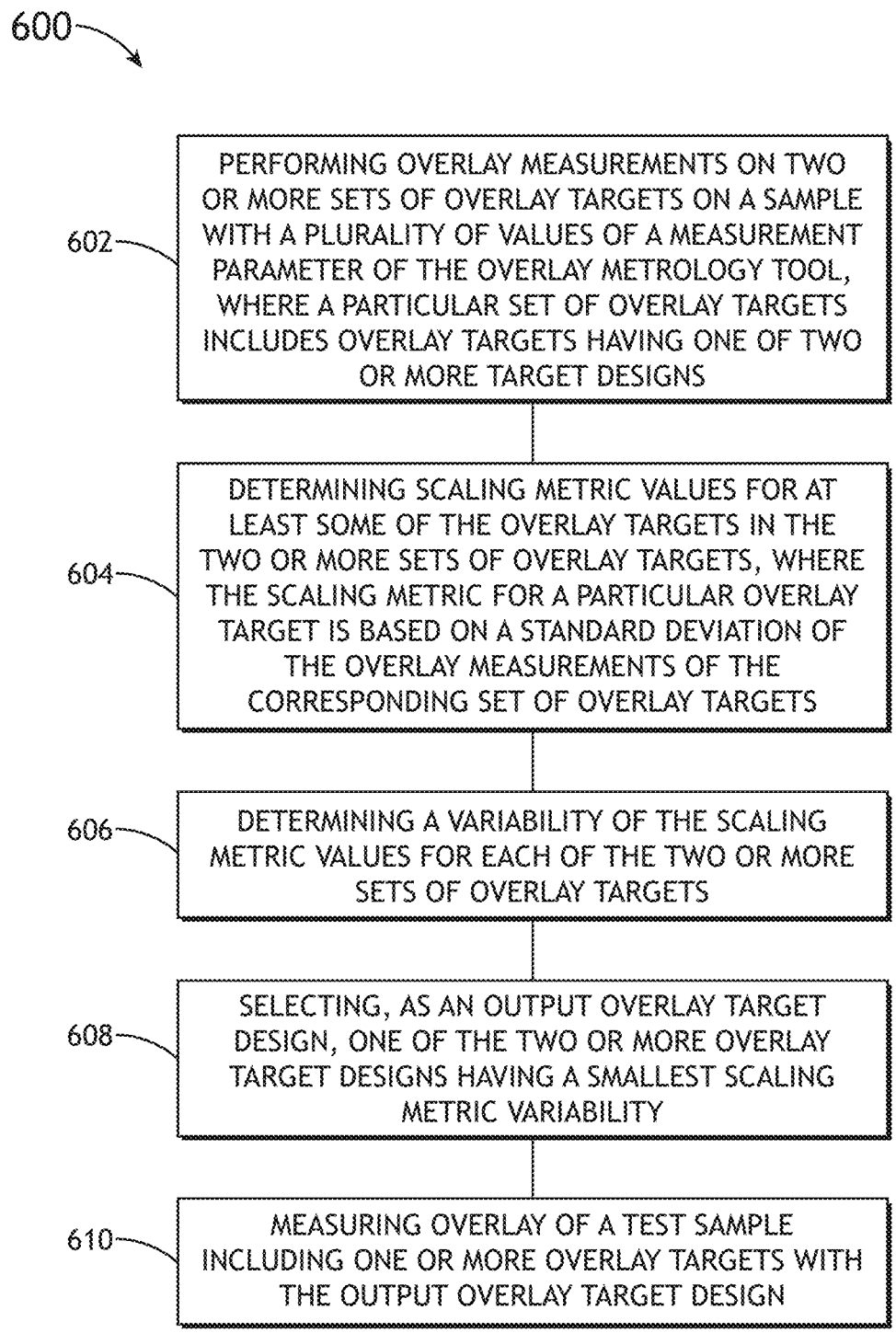
FIG. 6 is a flow diagram illustrating steps performed in a method for selecting an overlay target design, in accordance with one or more embodiments of the present disclosure.

FIG. 6 is a flow diagram illustrating steps performed in a method 600 for selecting an overlay target design, in accordance with one or more embodiments of the present disclosure. For example, an overlay target design may be selected out of a series of candidate target designs based on S-metric calculations to provide robust overlay metrology. Applicant notes that the embodiments and enabling technologies described previously herein in the context of the overlay metrology system 100 should be interpreted to extend to method 600. It is further noted, however, that the method 600 is not limited to the architecture of the overlay metrology system 100.

In one embodiment, the method 600 includes a step 602 of performing overlay measurements on two or more sets of overlay targets on a sample with a plurality of values of a measurement parameter of the overlay metrology tool, where a particular set of overlay targets includes overlay targets having one of two or more overlay target designs. For example, the different target designs may have different sizes, orientations, and/or distributions of features. Further, the target designs may be suitable for imaging-based overlay measurements or scatterometry-based overlay measurements.

The measurement parameters of the overlay metrology tool may include any parameter associated with a metrology recipe such as, but not limited to, an illumination wavelength, a detected wavelength of radiation emanating from the sample, a spot size of illumination on the sample, an angle of incident illumination, a polarization of incident illumination, a position of a beam of incident illumination on an overlay target, or a position of an overlay target in the focal volume of the overlay metrology tool.

In another embodiment, the method 600 includes a step 604 of determining scaling metric values for at least some of the overlay targets in the two or more sets of overlay targets, where the scaling metric for a particular overlay target is based on a standard deviation of the overlay measurements of the corresponding set of overlay targets. In one embodiment, the scaling metric corresponds to the S-metric in Equations (3) and (4). In this regard, the scaling metric may correspond to a weighted standard deviation of the overlay measurements, where the weights are determined based on any quality metric known in the art such as, but not limited to, contrast or sensitivity. In another embodiment, the scaling metric corresponds to an unweighted standard deviation of the overlay measurements.

In another embodiment, the method 600 includes a step 606 of determining a variability of the scaling metric values for each of the two or more sets of overlay targets. In this regard, the S-metric variability associated with each of the two or more overlay target designs may be evaluated. The variability may include any statistical measure of variability known in the art including, but not limited to, standard deviation, variance, or the like.

In another embodiment, the method 600 includes a step 608 of selecting, as an output overlay target design, one of the two or more overlay target designs having a smallest scaling metric variability. In another embodiment, the method 600 includes a step 610 of measuring overlay of a test sample including one or more overlay targets with the output overlay target design. In this regard, the output overlay target design selected by method 600 may be implemented in a production line for the fabrication of one or more devices.

Figure 7A:
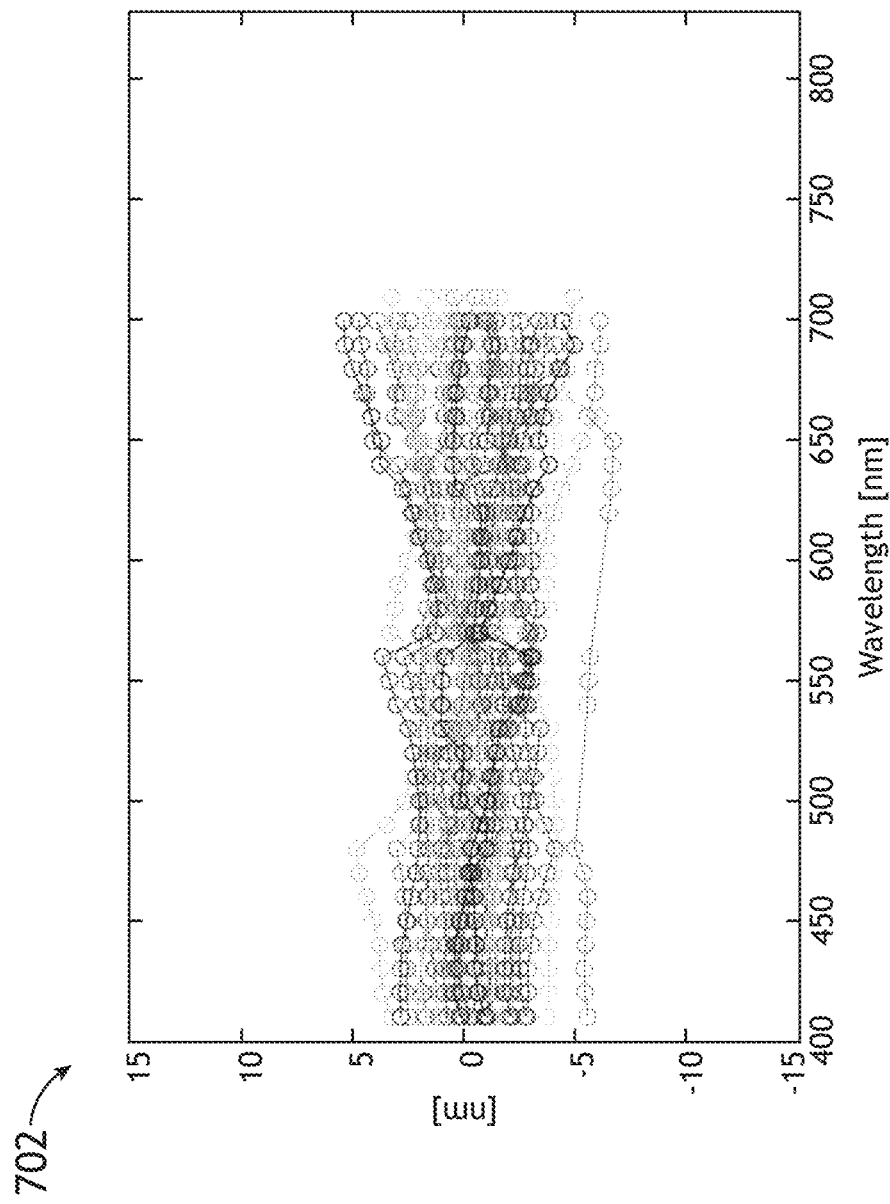
FIG. 7A is a plot of S-metrics for overlay targets having a first overlay target design distributed across a sample having process variations, in accordance with one or more embodiments of the present disclosure.
Figure 7B:
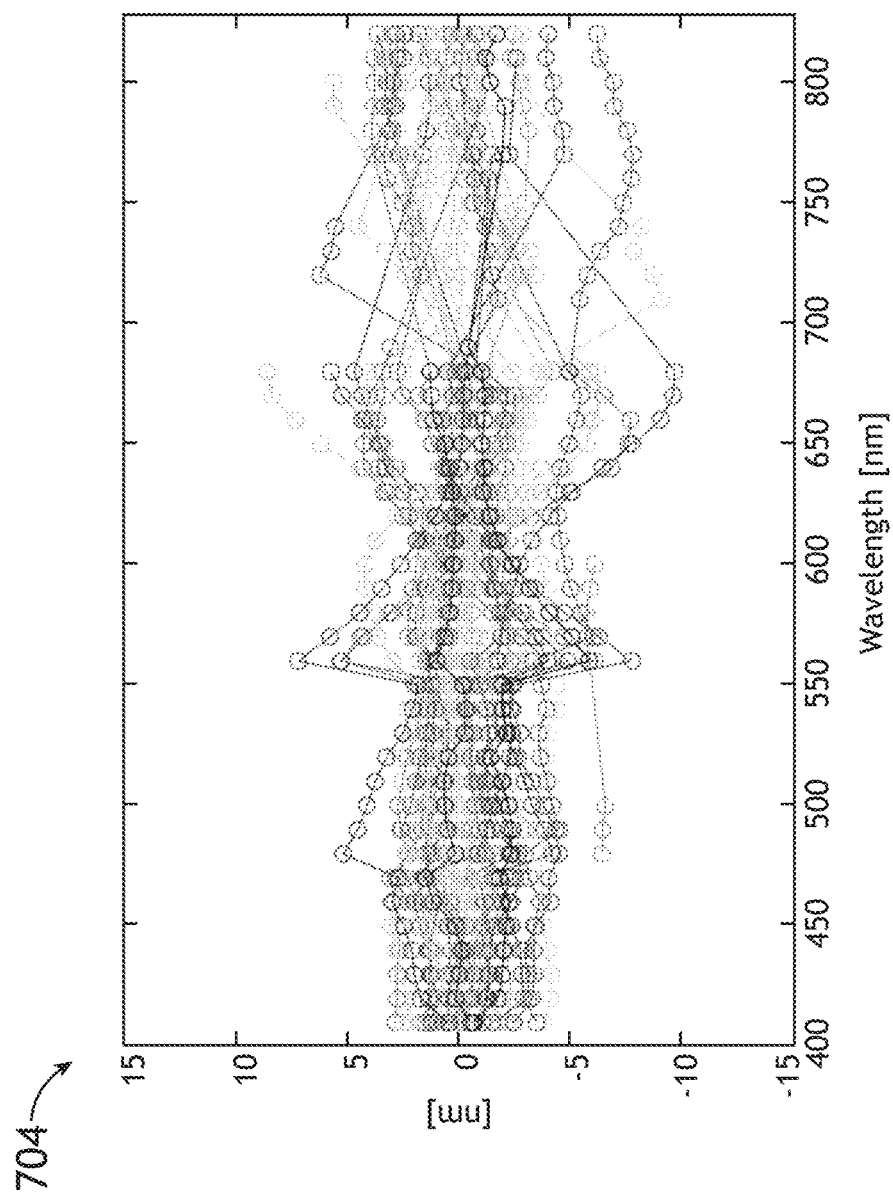
FIG. 7B is a plot of S-metrics for overlay targets having a second overlay target design distributed across a sample having process variations, in accordance with one or more embodiments of the present disclosure.

FIGS. 7A and 7B illustrate selection of an overlay target design based on S-metric variability. FIG. 7A is a plot 702 of S-metrics for overlay targets having a first overlay target design distributed across a sample having process variations, in accordance with one or more embodiments of the present disclosure. FIG. 7B is a plot 704 of S-metrics for overlay targets having a second overlay target design distributed across a sample having process variations, in accordance with one or more embodiments of the present disclosure. Based on FIGS. 7A and 7B, the first overlay target design has a smaller S-metric variability (e.g., a smallest $3\sigma$, or the like) as a function of wavelength. In this regard, the first overlay target design may provide relatively more robust overlay measurements.

It is further contemplated herein that S-metric variability may be utilized to evaluate and/or select a metrology recipe (e.g., a hardware configuration of the overlay metrology tool).

Figure 8:
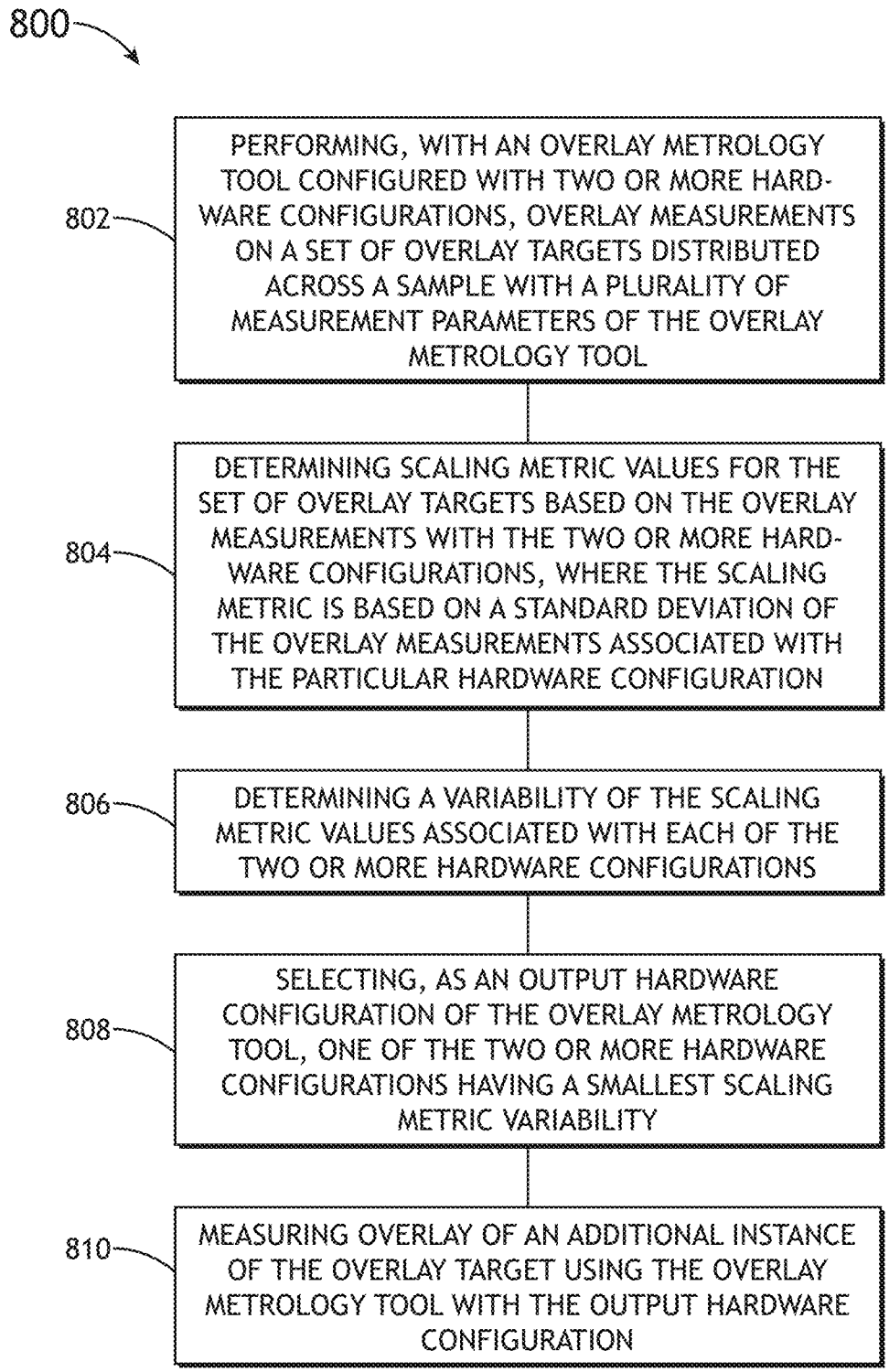
FIG. 8 is a flow diagram illustrating steps performed in a method for selecting a hardware configuration of an overlay metrology tool, in accordance with one or more embodiments of the present disclosure.

FIG. 8 is a flow diagram illustrating steps performed in a method 800 for selecting a hardware configuration of an overlay metrology tool, in accordance with one or more embodiments of the present disclosure. For example, an overlay target design may be selected out of a series of candidate target designs based on S-metric calculations to provide robust overlay metrology. Applicant notes that the embodiments and enabling technologies described previously herein in the context of the overlay metrology system 100 should be interpreted to extend to method 800. It is further noted, however, that the method 800 is not limited to the architecture of the overlay metrology system 100.

In one embodiment, the method 800 includes a step 802 of performing, with an overlay metrology tool configured with two or more hardware configurations, overlay measurements on a set of overlay targets distributed across a sample with a plurality of measurement parameters of the overlay metrology tool.

The measurement parameters of the overlay metrology tool may include any parameter associated with a metrology recipe such as, but not limited to, an illumination wavelength, a detected wavelength of radiation emanating from the sample, a spot size of illumination on the sample, an angle of incident illumination, a polarization of incident illumination, a position of a beam of incident illumination on an overlay target, or a position of an overlay target in the focal volume of the overlay metrology tool. Further, the different hardware configurations may include any configurations associated with a metrology recipe. In this regard, the method 800 may facilitate selection of one or more parameters of the metrology recipe to be robust to process variations.

In another embodiment, the method 800 includes a step 804 of determining scaling metric values for the set of overlay targets based on the overlay measurements with the two or more hardware configurations, where the scaling metric for a particular overlay target in the set of overlay target measured with a particular hardware configuration of the two or more hardware configurations is based on a standard deviation of the overlay measurements associated with the particular hardware configuration. In one embodiment, the scaling metric corresponds to the S-metric in Equations (3) and (4). In this regard, the scaling metric may correspond to a weighted standard deviation of the overlay measurements, where the weights are determined based on any quality metric known in the art such as, but not limited to, contrast or sensitivity. In another embodiments, the scaling metric corresponds to an unweighted standard deviation of the overlay measurements.

In another embodiment, the method 800 includes a step 806 of determining a variability of the scaling metric values associated with each of the two or more hardware configurations. In this regard, the S-metric variability associated with each of the two or more overlay target designs may be evaluated. The variability may include any statistical measure of variability known in the art including, but not limited to, standard deviation, variance, or the like.

In another embodiment, the method 800 includes a step 808 of selecting, as an output hardware configuration of the overlay metrology tool, one of the two or more hardware configurations having a smallest scaling metric variability. In another embodiment, the method 800 includes a step 810 of measuring overlay of an additional instance of the overlay target using the overlay metrology tool with the output hardware configuration.

In some embodiments, the evaluation of S-metrics for overlay targets across a sample may be used to develop site-specific scaling factors to correct a per-site overlay inaccuracy.

Figure 9:
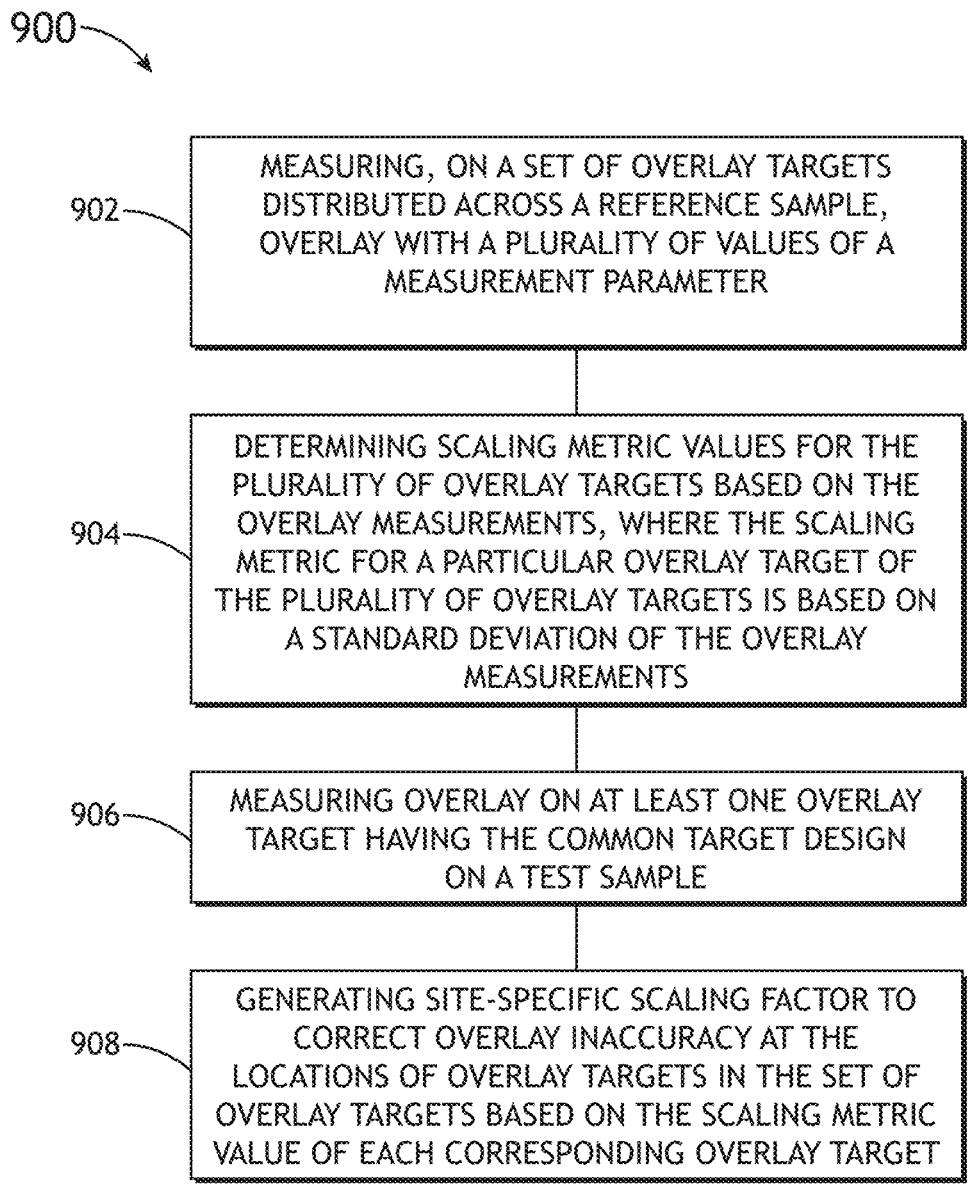
FIG. 9 is a flow diagram illustrating steps performed in a method for generating site-specific scaling factors to correct for site-specific overlay inaccuracies, in accordance with one or more embodiments of the present disclosure.

FIG. 9 is a flow diagram illustrating steps performed in a method 900 for generating site-specific scaling factors to correct for site-specific overlay inaccuracies, in accordance with one or more embodiments of the present disclosure. For example, an overlay target design may be selected out of a series of candidate target designs based on S-metric calculations to provide robust overlay metrology. Applicant notes that the embodiments and enabling technologies described previously herein in the context of the overlay metrology system 100 should be interpreted to extend to method 900. It is further noted, however, that the method 900 is not limited to the architecture of the overlay metrology system 100.

In one embodiment, the method 900 includes a step 902 of measuring, on a set of overlay targets distributed across a reference sample, overlay with a plurality of values of a measurement parameter, where the set of overlay targets have a common target design, and where the plurality of overlay targets include a known spatial distribution of fabrication errors. In another embodiment, the method 900 includes a step 904 of determining scaling metric values for the plurality of overlay targets based on the overlay measurements, where the scaling metric for a particular overlay target of the plurality of overlay targets is based on a standard deviation of the overlay measurements. In another embodiment, the method 900 includes a step 906 of measuring overlay on at least one overlay target having the common target design on a test sample. In another embodiment, the method 900 includes a step 908 of generating site-specific scaling factor to correct overlay inaccuracy at the locations of overlay targets in the set of overlay targets based on the scaling metric value of each corresponding overlay target.

Figure 10:
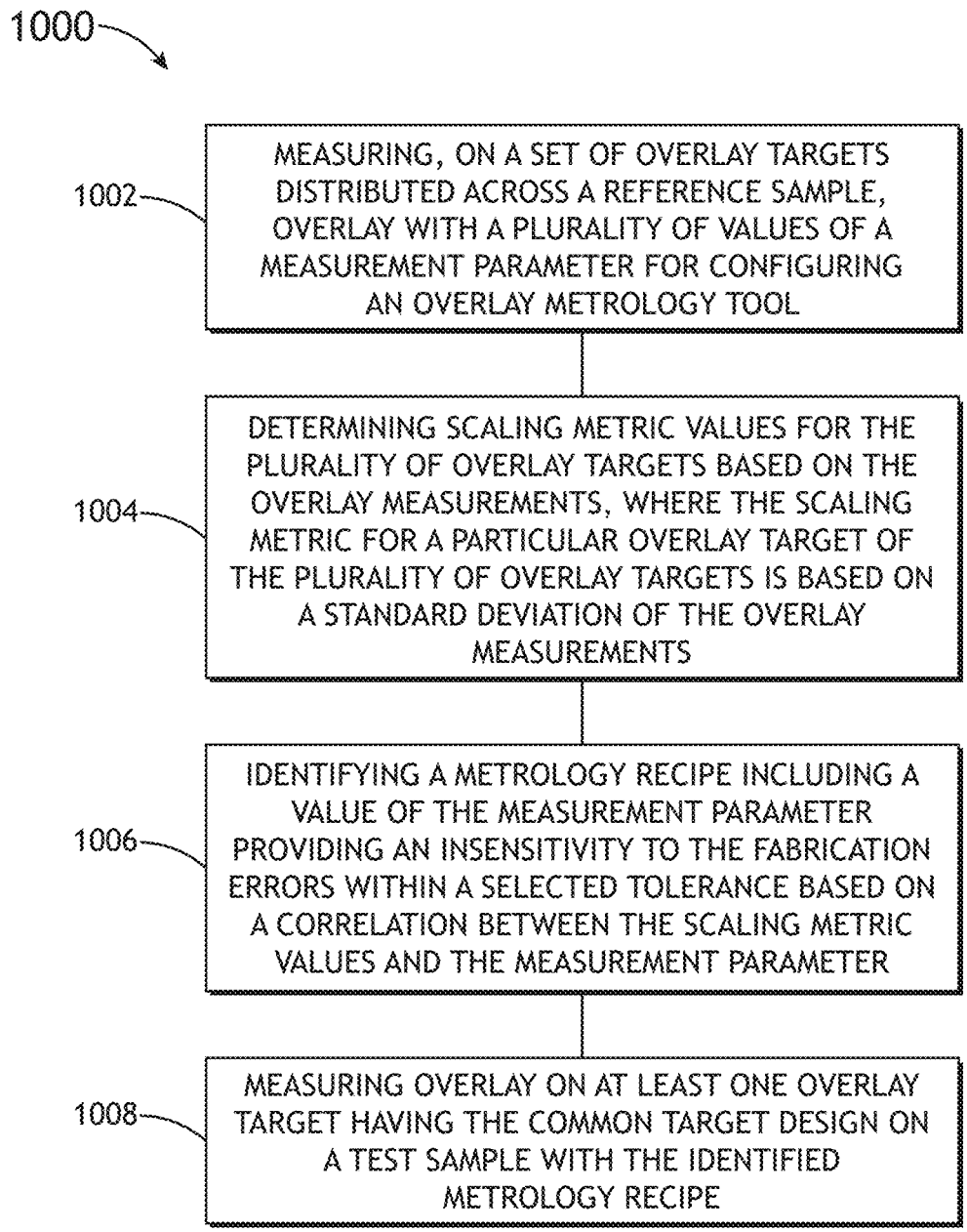
FIG. 10 is a flow diagram illustrating steps performed in a method for identifying a metrology recipe that is robust to process variations, in accordance with one or more embodiments of the present disclosure.

In some embodiments, the scaling metric may be utilized to optimize a metrology recipe to provide overlay measurements that are robust to process variations. FIG. 10 is a flow diagram illustrating steps performed in a method 1000 for identifying a metrology recipe that is robust to process variations, in accordance with one or more embodiments of the present disclosure. For example, an overlay target design may be selected out of a series of candidate target designs based on S-metric calculations to provide robust overlay metrology. Applicant notes that the embodiments and enabling technologies described previously herein in the context of the overlay metrology system 100 should be interpreted to extend to method 1000. It is further noted, however, that the method 1000 is not limited to the architecture of the overlay metrology system 100.

In one embodiment, the method 1000 includes a step 1002 of measuring, on a set of overlay targets distributed across a reference sample, overlay with a plurality of values of a measurement parameter for configuring an overlay metrology tool, where the set of overlay targets have a common target design, and where the plurality of overlay targets include a known spatial distribution of fabrication errors. In another embodiment, the method 1000 includes a step 1004 of determining scaling metric values for the plurality of overlay targets based on the overlay measurements, where the scaling metric for a particular overlay target of the plurality of overlay targets is based on a standard deviation of the overlay measurements. In another embodiment, the method 1000 includes a step 1006 of identifying a metrology recipe including a value of the measurement parameter providing an insensitivity to the fabrication errors within a selected tolerance based on a correlation between the scaling metric values and the measurement parameter. For example, an accurate measurement parameter (e.g., an accurate recipe) may be identified based on calculating: min (S(sites)−ovl$_i$). In another embodiment, the method 1000 includes a step 1008 of measuring overlay on at least one overlay target having the common target design on a test sample with the identified metrology recipe.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
 a controller configured to be communicatively coupled with an overlay metrology tool, the controller including one or more processors configured to execute program instructions causing the one or more processors to:
 receive, from the overlay metrology tool, overlay measurements on two or more sets of overlay targets on a sample with a plurality of values of a measurement parameter for configuring the overlay metrology tool, wherein a particular set of overlay targets includes overlay targets having one of two or more overlay target designs;
 determine scaling metric values for at least some of the overlay targets in the two or more sets of overlay targets, wherein the scaling metric for a particular overlay target is based on a standard deviation of the overlay measurements of the corresponding set of overlay targets;
 determine a variability of the scaling metric values for each of the two or more sets of overlay targets; and
 select, as an output overlay target design, one of the two or more overlay target designs having a smallest scaling metric variability, wherein the output overlay target design is provided to one or more fabrication tools to fabricate an overlay target based on the output overlay target design on a test sample for measurement with the overlay metrology tool.

2. The system of claim 1, wherein the scaling metric is based on a weighted standard deviation of the overlay measurements.

3. The system of claim 2, wherein weights of the weighted standard deviation of the overlay measurements are based on at least one of contrast or sensitivity of a measurement signal generated by the overlay metrology tool.

4. The system of claim 1, wherein the scaling metric ($S_{metric}$) is $S_{metric} = \chi \cdot \sqrt{\Sigma_{i=1}^{N} w_i (ovl_i - \langle ovl \rangle)^2}$, with $\langle ovl \rangle = \Sigma_{i=1}^{N} w_i ovl_i$, where is a number of the overlay measurements, i is a measurement parameter index, $ovl_i$ is a value of the overlay measurement for a measurement parameter index, $\langle ovl \rangle$ is a weighted average of the N overlay measurements, w is a weight for each of the N overlay measurements, and $\chi$ is either +1 or −1 and corresponds to a sign of an asymmetry of an overlay target in the two or more sets of overlay targets.

5. The system of claim 1, wherein the measurement parameter comprises:
   a wavelength of illumination in the overlay metrology tool.

6. The system of claim 1, wherein the measurement parameter comprises:
   a polarization of illumination in the overlay metrology tool.

7. The system of claim 1, wherein the overlay metrology tool comprises:
   an image-based overlay metrology tool.

8. The system of claim 1, wherein the overlay metrology tool comprises:
   a scatterometry-based overlay metrology tool.

9. An overlay metrology system comprising:
   a controller configured to be communicatively coupled with an overlay metrology tool, the controller including one or more processors configured to execute program instructions causing the one or more processors to:
   receive, from the overlay metrology tool configured with two or more hardware configurations, overlay measurements on a set of overlay targets distributed across a sample with a plurality of values of a measurement parameter for configuring the overlay metrology tool;
   determine scaling metric values for the set of overlay targets based on the overlay measurements with the two or more hardware configurations, wherein the scaling metric for a particular overlay target in the set of overlay target measured with a particular hardware configuration of the two or more hardware configurations is based on a standard deviation of the overlay measurements associated with the particular hardware configuration;
   determine a variability of the scaling metric values associated with each of the two or more hardware configurations; and
   select, as an output hardware configuration of the overlay metrology tool, one of the two or more hardware configurations having a smallest scaling metric variability, wherein the output hardware configuration is provided to the overlay metrology tool for measurement of one or more additional instances of the overlay target.

10. The system of claim 9, wherein the scaling metric is based on a weighted standard deviation of the overlay measurements.

11. The system of claim 10, wherein weights of the weighted standard deviation of the overlay measurements are based on at least one of contrast or sensitivity of a measurement signal generated by the overlay metrology tool.

12. The system of claim 9, wherein the scaling metric ($S_{metric}$) is $S_{metric} = \chi \cdot \sqrt{\Sigma_{i=1}^{N} w_i (ovl_i - \langle ovl \rangle)^2}$, with $\langle ovl \rangle = \Sigma_{i=1}^{N} w_i ovl_i$, where is a number of the overlay measurements, i is a measurement parameter index, $ovl_i$ is a value of the overlay measurement for a measurement parameter index, $\langle ovl \rangle$ is a weighted average of the N overlay measurements, w is a weight for each of the N overlay measurements, and $\chi$ is either +1 or −1 and corresponds to a sign of an asymmetry of an overlay target in the set of overlay targets.

13. The system of claim 9, wherein the measurement parameter comprises:
   a wavelength of illumination in the overlay metrology tool.

14. The system of claim 9, wherein the measurement parameter comprises:
   a polarization of illumination in the overlay metrology tool.

15. The system of claim 9, wherein the overlay metrology tool comprises:
   an image-based overlay metrology tool.

16. The system of claim 9, wherein the overlay metrology tool comprises:
   a scatterometry-based overlay metrology tool.

17. An overlay metrology system comprising:
   a controller configured to be communicatively coupled with an overlay metrology tool, the controller including one or more processors configured to execute program instructions causing the one or more processors to:
   receive a set of site-specific scaling factors to correct overlay inaccuracy at a set of overlay locations, wherein the site-specific scaling factors are generated based on overlay measurements of a set of reference overlay targets distributed at the set of overlay locations with a plurality of values of a measurement parameter, wherein the set of reference overlay targets have a common target design, wherein the set of reference overlay targets include a known spatial distribution of fabrication errors, wherein the site-specific scaling factors are based on a standard deviation of the overlay measurements;
   receive at least one test overlay measurement from at least one overlay target having the common target design located on at least one location in the set of overlay locations on a test sample; and
   correct at least one test overlay measurement with the corresponding site-specific scaling factor.

18. The system of claim 17, wherein at least some of the site-specific scaling factors are based on a weighted standard deviation of the overlay measurements.

19. The system of claim 18, wherein weights of the weighted standard deviation of the overlay measurements are based on at least one of contrast or sensitivity of a measurement signal generated by the overlay metrology tool.

20. The system of claim 17, wherein the scaling metric ($S_{metric}$) is $S_{metric} = \chi \cdot \sqrt{\Sigma_{i=1}^{N} w_i (ovl_i - \langle ovl \rangle)^2}$, with $\langle ovl \rangle = \Sigma_{i=1}^{N} w_i ovl_i$, where is a number of the overlay measurements, i is a measurement parameter index, $ovl_i$ is a value of the overlay measurement for a measurement parameter index, $\langle ovl \rangle$ is a weighted average of the N overlay measurements, w is a weight for each of the N overlay measurements, and $\chi$ is either +1 or −1 and corresponds to a sign of an asymmetry of an overlay target in the set of reference overlay targets.

21. The system of claim 17, wherein the measurement parameter comprises:
   a wavelength of illumination in the overlay metrology tool.

22. The system of claim 17, wherein the measurement parameter comprises:

a polarization of illumination in the overlay metrology tool.

23. The system of claim 17, wherein the overlay metrology tool comprises:
an image-based overlay metrology tool.

24. The system of claim 17, wherein the overlay metrology tool comprises:
a scatterometry-based overlay metrology tool.

25. A method comprising:
acquiring overlay measurements of two or more sets of overlay targets on a sample with a plurality of values of a measurement parameter for configuring an overlay metrology tool, wherein a particular set of overlay targets includes overlay targets having one of two or more overlay target designs;
determining scaling metric values for at least some of the overlay targets in the two or more sets of overlay targets, wherein the scaling metric for a particular overlay target is based on a standard deviation of the overlay measurements of the corresponding set of overlay targets;
determining a variability of the scaling metric values for each of the two or more sets of overlay targets; and
selecting, as an output overlay target design, one of the two or more overlay target designs having a smallest scaling metric variability, wherein the output overlay target design is provided to one or more fabrication tools to fabricate an overlay target based on the output overlay target design on a test sample for measurement with the overlay metrology tool.

26. A method comprising:
acquiring, with an overlay metrology tool configured with two or more hardware configurations, overlay measurements of a set of overlay targets distributed across a sample with a plurality of values of a measurement parameter for configuring the overlay metrology tool;
determining scaling metric values for the set of overlay targets based on the overlay measurements with the two or more hardware configurations, wherein the scaling metric for a particular overlay target in the set of overlay target measured with a particular hardware configuration of the two or more hardware configurations is based on a standard deviation of the overlay measurements associated with the particular hardware configuration;
determining a variability of the scaling metric values associated with each of the two or more hardware configurations; and
selecting, as an output hardware configuration of the overlay metrology tool, one of the two or more hardware configurations having a smallest scaling metric variability, wherein the output hardware configuration is provided to the overlay metrology tool for measurement of one or more additional instances of the overlay target.

27. A method comprising:
acquiring a set of site-specific scaling factors to correct overlay inaccuracy at a set of overlay locations, wherein the site-specific scaling factors are generated based on overlay measurements of a set of reference overlay targets distributed at the set of overlay locations with a plurality of values of a measurement parameter, wherein the set of reference overlay targets have a common target design, wherein the set of reference overlay targets include a known spatial distribution of fabrication errors, wherein the site-specific scaling factors are based on a standard deviation of the overlay measurements;
acquiring at least one test overlay measurement from at least one overlay target having the common target design located on at least one location in the set of overlay locations on a test sample; and
correcting at least one test overlay measurement with the corresponding site-specific scaling factor.

* * * * *